(12) United States Patent
Lee et al.

(10) Patent No.: US 11,742,034 B2
(45) Date of Patent: *Aug. 29, 2023

(54) MEMORY DEVICE INCLUDING DYNAMIC PROGRAMMING VOLTAGE

(71) Applicant: Micron Technology, Inc., Boise, ID (US)

(72) Inventors: Eric N. Lee, San Jose, CA (US); Lawrence Celso Miranda, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,415

(22) Filed: May 16, 2022

(65) Prior Publication Data

US 2022/0351787 A1    Nov. 3, 2022

Related U.S. Application Data

(63) Continuation of application No. 17/135,321, filed on Dec. 28, 2020, now Pat. No. 11,335,418.

(Continued)

(51) Int. Cl.
*G11C 11/34* (2006.01)
*G11C 16/34* (2006.01)
(Continued)

(52) U.S. Cl.
CPC .......... *G11C 16/3404* (2013.01); *G11C 16/10* (2013.01); *G11C 16/26* (2013.01); *G11C 16/30* (2013.01)

(58) Field of Classification Search
CPC ......... G11C 16/10; G11C 16/30; G11C 16/12; G11C 16/0483
(Continued)

(56) References Cited

U.S. PATENT DOCUMENTS

| 11,335,418 B2* | 5/2022 | Lee ..................... G11C 16/3404 |
| 2012/0163076 A1* | 6/2012 | Sarin ................ G11C 29/50004 |
| | | 365/185.03 |

(Continued)

FOREIGN PATENT DOCUMENTS

| CN | 113129973 | 7/2021 |
| KR | 20120035064 | 4/2012 |

OTHER PUBLICATIONS

"Korean Application Serial No. 10-2020-0187665, Notice of Preliminary Rejection dated Dec. 24, 2021", with English translation, 12 pages.

(Continued)

*Primary Examiner* — Son T Dinh
(74) *Attorney, Agent, or Firm* — Schwegman Lundberg & Woessner, P.A.

(57) ABSTRACT

Some embodiments include apparatus and methods using access lines, first memory cells coupled to an access line of the access lines, and a control unit including circuitry. The control unit is configured to apply a first voltage to the access line; check first threshold voltages of the first memory cells after applying the first voltage; obtain offset information based on a determination that at least one of the first threshold voltages is greater than a selected voltage; generate a second voltage, the second voltage being a function of the first voltage and the offset information; and apply the second voltage to one of the access lines during an operation of storing information in second memory cells.

20 Claims, 10 Drawing Sheets

Related U.S. Application Data

(60) Provisional application No. 62/954,990, filed on Dec. 30, 2019.

(51) Int. Cl.
  *G11C 16/26*  (2006.01)
  *G11C 16/10*  (2006.01)
  *G11C 16/30*  (2006.01)

(58) Field of Classification Search
  USPC .................................... 365/185.18, 185.22
  See application file for complete search history.

(56) References Cited

U.S. PATENT DOCUMENTS

| | | |
|---|---|---|
| 2014/0177341 A1 | 6/2014 | Kono |
| 2018/0294036 A1 | 10/2018 | Oh et al. |
| 2019/0066804 A1* | 2/2019 | Vali ..................... G11C 29/028 |
| 2021/0202019 A1 | 7/2021 | Lee et al. |

OTHER PUBLICATIONS

"Korean Application Serial No. 10-2020-0187665, Response Filed Jun. 23, 2022 to Notice of Preliminary Rejection dated Dec. 24, 2021", with English claims, 24 pages.

\* cited by examiner

| COUNT VALUE P (BYTES) | V_offset (mV) |
|---|---|
| 1 | 0 |
| 2 | 47 |
| 4 | 96 |
| 8 | 149 |
| 16 | 204 |
| 32 | 264 |
| 64 | 328 |
| 128 | 400 |
| 256 | 429 |

FIG. 8

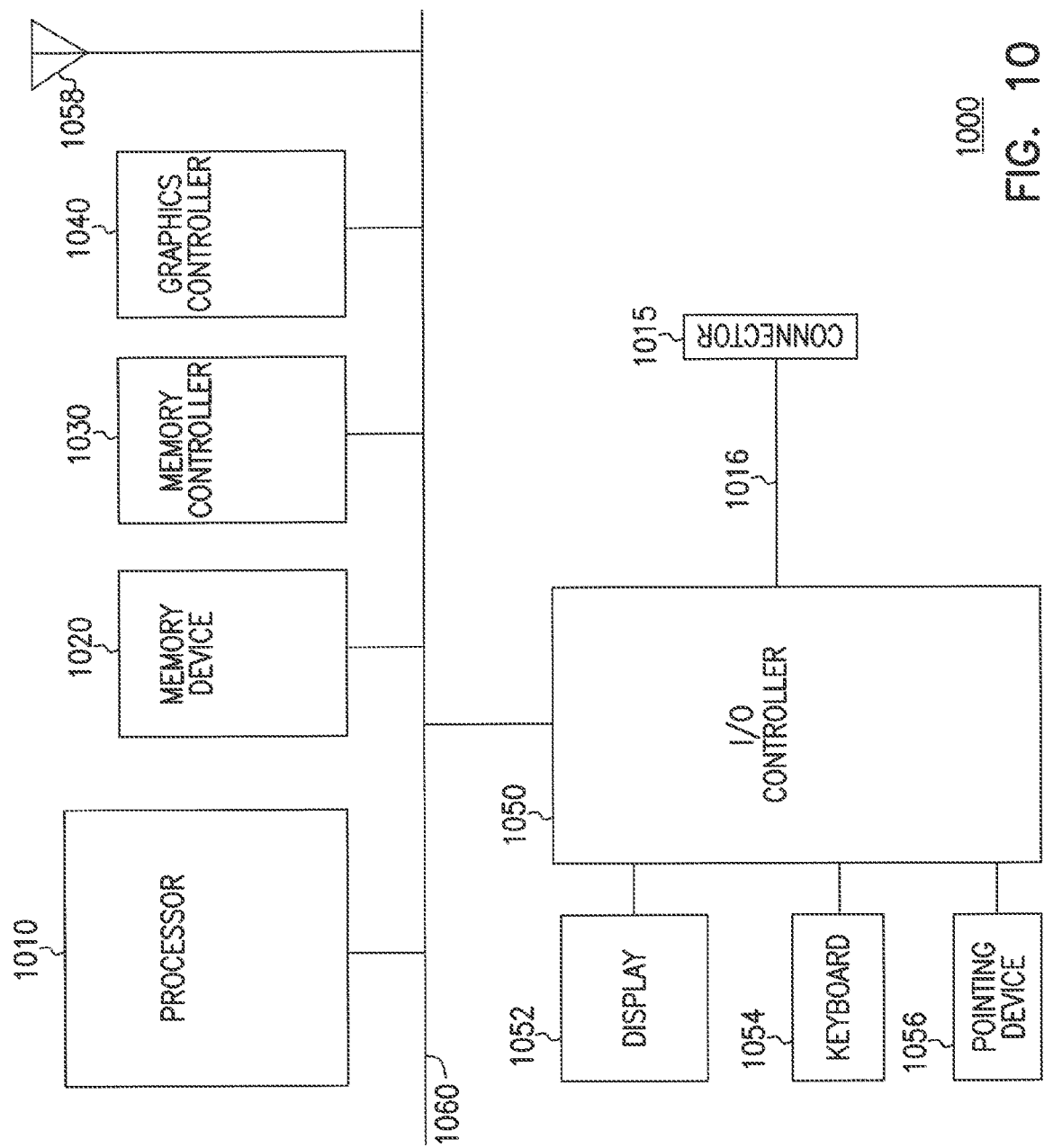

MEMORY DEVICE INCLUDING DYNAMIC PROGRAMMING VOLTAGE

PRIORITY APPLICATION

This application is a continuation of U.S. application Ser. No. 17/135,321, filed Dec. 28, 2020, which claims the benefit of priority to U.S. Application Ser. No. 62/954,990, filed Dec. 30, 2019, all of which are incorporated herein by reference in their entirety.

FIELD

Embodiments of this disclosure relate to memory devices, including write operations in non-volatile memory devices.

BACKGROUND

Non-volatile memory devices, such as flash memory devices, are widely used in computers and many electronic items. A flash memory device has numerous memory cells. Information (e.g., user data) can be stored in the memory cells in a write operation (also called program operation). The stored information can be obtained (e.g., read) from the memory cells in a read operation. Information (e.g., obsolete data) from a portion or from all of the memory cells can be erased in an erase operation. Storing information in a particular memory cell often involves causing that particular memory cell to have a threshold voltage within a target threshold voltage range. A target threshold voltage range is a predetermined range of threshold voltages corresponding to a value (e.g., binary value) of the information to be stored in a memory cell. Different target threshold voltage ranges correspond to different values of the information to be stored in the memory cells.

Part of a conventional write operation includes applying a program signal (e.g., a voltage signal) to an access line (e.g., word line) coupled to a selected memory cell (a memory cell selected to store information). Such a program signal is normally provided with a start voltage (e.g., an initial voltage). Then, the voltage on the program signal is gradually increased until the threshold voltage of the selected memory cell reaches a target threshold voltage. In a conventional write operation, the value of the start voltage is often selected to be relatively low to prevent the threshold voltage of the selected memory cell from inadvertently exceeding the target threshold voltage range.

During a life-time of the memory device, the memory cells are often cycling through many write and erase operations. The cycling may cause a shift in the threshold voltage range of the memory cells with respect to a program signal used during a write operation. Such a shift can change the relationship between the start voltage and the threshold voltage range. The performance of the write operation in a conventional memory device may be degraded if the shift in threshold voltage range is ignored.

BRIEF DESCRIPTION OF THE DRAWINGS

FIG. 8 is a table (e.g., lookup table) showing entries containing example values of a count value and entries containing example values of offset information, according to some embodiments described herein.

FIG. 10 shows an apparatus in the form of a system including a memory device, according to some embodiments described herein.

DETAILED DESCRIPTION

The techniques described herein involve a memory device having structures (e.g., circuitry) and methods (e.g., operations) to adjust the value of a start voltage (e.g., a program voltage) in a write operation of the memory device. The start voltage can be provided in the form of a signal (e.g., program voltage pulse). The start voltage can be applied (e.g., at the beginning) of a program event performed by the memory device. A program event can be part of a write operation to store information in memory cells of the memory device. During a program event, the described memory device can perform a sampling operation on a portion of the memory cells. Based on the result of the sampling operation, the memory device can determine offset information. Then, the memory device uses the offset information to adjust (e.g., dynamically and continuously adjust) the value of the start voltage in an operation (e.g., write operation) of the memory device.

The techniques described herein can improve or maintain the efficiency of the write operation of the memory device. For example, the adjustment of the start voltage can improve (e.g., reduce) programming time for part of a write operation, and counter (e.g., minimize) the effect of variation in threshold voltages of memory cells of the memory device, minimize performance penalty, and improve scaling. Other improvements and benefits of the techniques described herein are discussed below with reference to the description of FIG. 1 through FIG. 10.

Figure 1:
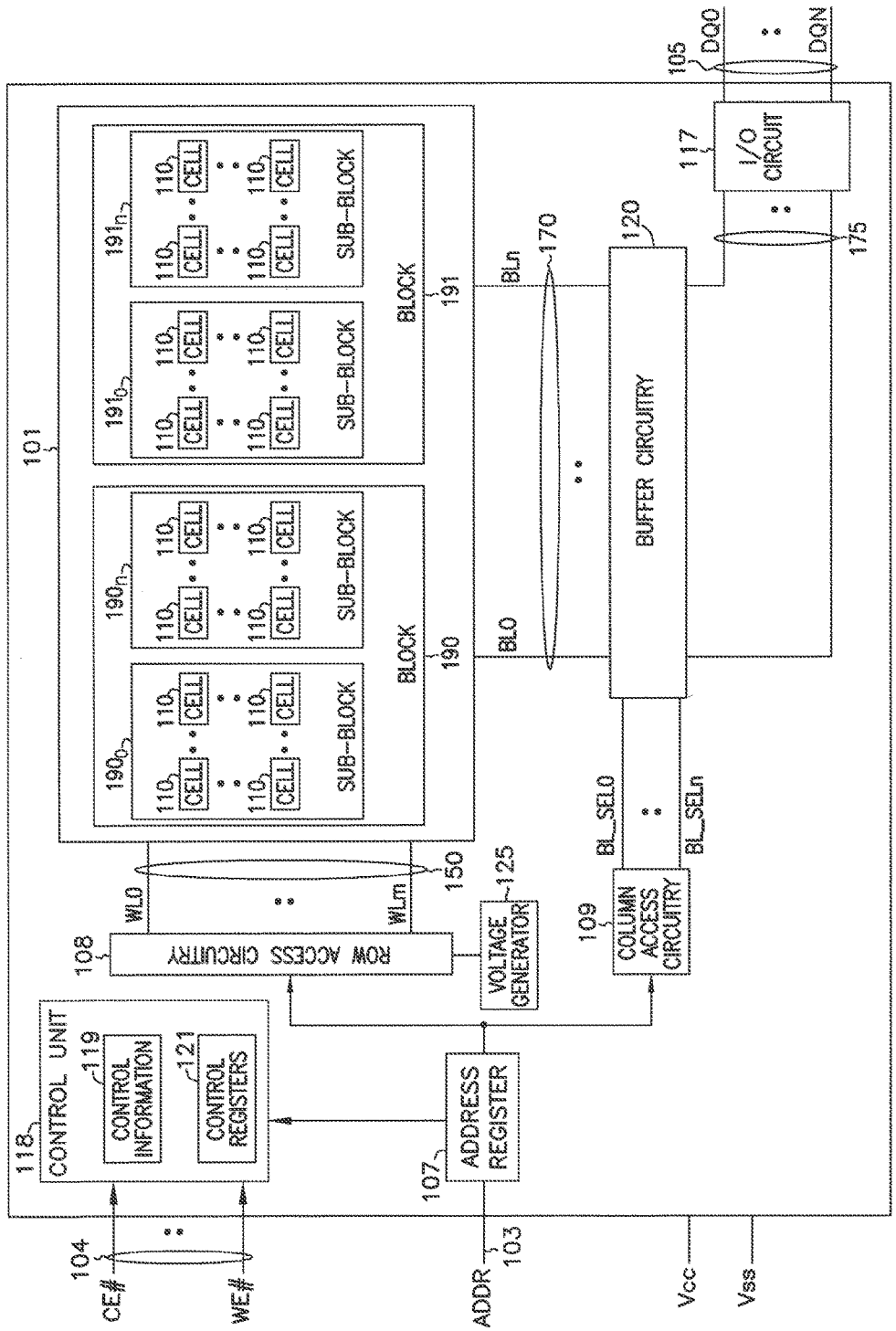
FIG. 1 shows a block diagram of an apparatus in the form of a memory device including blocks and sub-blocks of memory cells, according to some embodiments described herein.

FIG. 1 shows a block diagram of an apparatus in the form of a memory device 100 including a block and sub-blocks of memory cells, according to some embodiments described herein. Memory device 100 can include a memory array (or multiple memory arrays) 101 containing memory cells 110.

In the physical structure of memory device 100, memory cells 110 can be arranged vertically (e.g., stacked over each other) over a substrate of memory device 100 (e.g., a semiconductor substrate of an IC chip that includes memory device 100). Memory cells 110 can include non-volatile cells. For example, memory cells 110 can include floating gate memory cells, charge trap memory cells, or other types of non-volatile memory cells.

As shown in FIG. 1, memory cells 110 can be arranged in blocks (memory cell blocks), such as blocks 190 and 191. Each of blocks 190 and 191 can include sub-blocks. For example, block 190 can include sub-blocks $190_0$ and $190_n$, and block 191 can include sub-blocks $191_0$ and $191_n$. FIG. 1 shows memory device 100 having two blocks 190 and 191 and two sub-blocks in each of blocks 190 and 191 as an example. Memory device 100 can have more than two blocks and more than two sub-blocks in each of the blocks.

Each of sub-blocks $190_0$, $190_n$, $191_0$, and $191_n$ can include a different portion of memory cells 110. Each of blocks 190 and 191 can be independently accessed during an operation (e.g., read, write, or erase operation) of memory device 100. For example, memory device 100 can select block 190 to store information in a particular write operation while block 191 is unselected that particular write operation. Each sub-block (e.g., each of sub-blocks $190_0$ and $190_n$) in a block (e.g., block 190) can also be independently accessed during an operation (e.g., read, write, or erase operation) of memory device 100. For example, memory device 100 can select sub-block $190_0$ to store information in a particular write operation while other sub-blocks (e.g., sub-block $190_n$) of block 190 are unselected in that particular write operation.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access sub-blocks $190_0$, $190_n$, $191_0$, and $191_n$ of blocks 190 and 191 and data lines 170 to selectively exchange information (e.g., data) with memory cells 110 of blocks 190 and 191.

Memory device 100 can include an address register 107 to receive address information (e.g., address signals) ADDR on lines (e.g., address lines) 103. Memory device 100 can include row access circuitry 108 and column access circuitry 109 (e.g., part of decoder circuitry of memory device 100) that can decode address information from address register 107. Based on decoded address information, memory device 100 can determine which memory cells 110 of which sub-blocks of blocks 190 and 191 are to be accessed during a memory operation. Memory device 100 can perform a read operation to read (e.g., sense) information (e.g., previously stored information) in memory cells 110, or a write (e.g., program) operation to store (e.g., program) information in memory cells 110. Memory device 100 can use data lines 170 associated with signals BL0 through BLn to provide information to be stored in memory cells 110 or obtain information read (e.g., sensed) from memory cells 110. Memory device 100 can also perform an erase operation to erase information from some or all of memory cells 110 of blocks 190 and 191.

Memory device 100 can include a control unit 118 that can be configured to control memory operations (e.g., read, write, and erase operations) of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform. The signals on lines 104 can be provided to memory device 100 by an external device (e.g., a processor or a memory controller).

Memory device 100 can include buffer circuitry 120 that can include components such as sense amplifiers and page buffer circuits (e.g., data latches). Buffer circuitry 120 can respond to signals BL_SEL0 through BL_SELn from column access circuitry 109. Buffer circuitry 120 can be configured to determine (e.g., by sensing) the value of information read from memory cells 110 (e.g., during a read operation) of blocks 190 and 191 and provide the value of the information to lines (e.g., global data lines) 175. Buffer circuitry 120 can also be configured to use signals on lines 175 to determine the value of information to be stored (e.g., programmed) in memory cells 110 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 110 of blocks 190 and 191 and lines (e.g., I/O lines) 105. Signals DQ0 through DQN on lines 105 can represent information read from or stored in memory cells 110 of blocks 190 and 191. Lines 105 can include conductive nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry. Memory device 100 can also include a voltage generator 125 to provide different voltages to access lines 150 during operations (e.g., read, write, and erase operations) of memory device 100.

Each of memory cells 110 can be configured to store information representing a value (e.g., binary value) of at most a single bit, or a value of multiple bits such as two, three, four, or another number of bits. For example, each of memory cells 110 can be configured to store information representing a binary value "0" or "1" of a single bit. The single bit per cell is sometimes called a single-level cell. In another example, each of memory cells 110 can be configured to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A memory cell that has the ability to store multiple bits is sometimes called a multi-level cell (or multi-state cell).

The value of information (e.g., binary value) stored in a particular memory cell of memory cells 110 can be based on the threshold voltage (e.g., analog threshold voltage value) of that particular memory cell. In a write operation, memory device 100 can operate to change the threshold voltage of a particular memory cell to reflect the value of information stored in that particular memory cell.

Memory device 100 can include a non-volatile memory device, such that memory cells 110 can retain information stored thereon when power (e.g., voltage Vcc, Vss, or both)

is disconnected from memory device 100. For example, memory device 100 can be a flash memory device, such as a NAND flash (e.g., 3-directional (3-D) NAND) or a NOR flash memory device, or another kind of memory device, such as a variable resistance memory device (e.g., a phase change memory device or a resistive RAM (Random Access Memory) device).

Control unit 118 of memory device 100 can be also be configured to perform sampling operations. Memory device 100 can adjust a start voltage of a program event (e.g., which can be part of a write operation) performed on memory cells 110 based on the results of the sampling operation. The operations (e.g., sampling operations and the adjustment of the start voltage) in memory device 100 can be similar to (or the same as) the operations of the memory devices described below with reference to FIG. 2 through FIG. 10.

In FIG. 1, configuring control unit 118 to perform the operations described herein can include providing specific components in control unit 118 to perform (e.g., control) the described operations. Such specific components can include firmware, hardware, or software or any combination of firmware, hardware, and software. As an example, control unit 118 can include components such as a state machine (e.g., finite state machine), register circuits (e.g., control registers 121), read-only-memory (ROM), and other components (e.g., control information 119) that can be configured to control memory operations (e.g., read, write, and erase operations) of memory device 100. Some of the operations of memory device 100 may be based on (e.g., in response to) control signals on lines 104.

One of ordinary skill in the art may recognize that memory device 100 may include other components, several of which are not shown in FIG. 1 so as not to obscure the example embodiments described herein.

At least a portion of memory device 100 can include structures and perform operations similar to (or the same as) the structures and operations of any of the memory devices described below with reference to FIG. 2 through FIG. 10.

Figure 2:
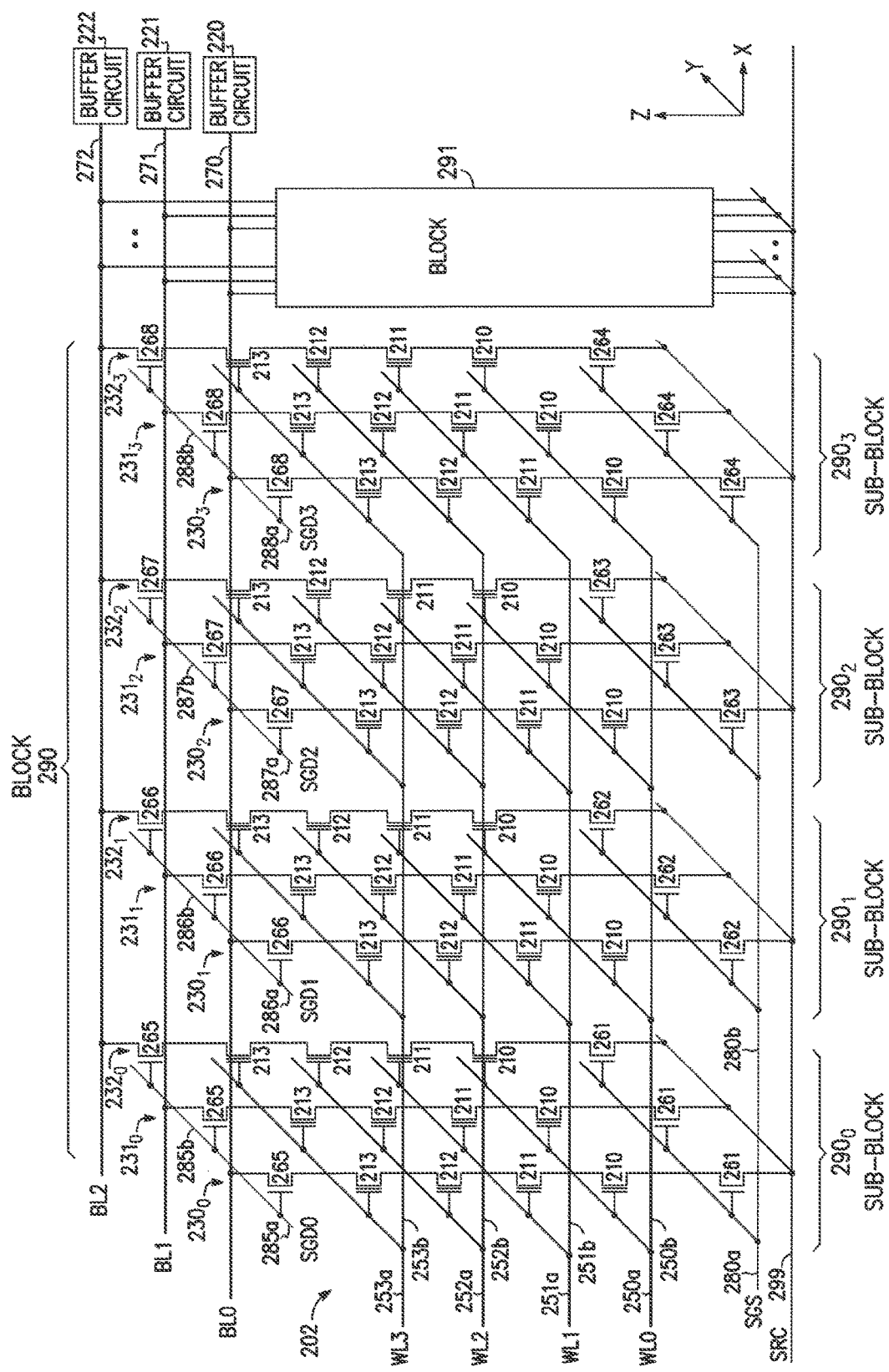
FIG. 2 shows a schematic diagram of a portion of a memory device including a memory array having blocks and sub-blocks of memory cells, access lines, data lines, and buffer circuits, according to some embodiments described herein.

FIG. 2 shows a schematic diagram of a portion of a memory device 200 including a memory array 202 having blocks (memory cell blocks) 290 and 291 and sub-blocks $290_0$, $290_1$, $290_2$, and $290_3$ in block 290; memory cells 210, 211, 212, and 213; access lines (e.g., word lines) 250a, 251a, 252a, and 253a associated with (e.g., coupled to) memory cells 210, 211, 212, and 213, respectively; data lines 270, 271, and 272; and buffer circuits 220, 221, and 222, according to some embodiments described herein. Memory device 200 can correspond to memory device 100 (FIG. 1). For example, memory array 202 can correspond to memory array 101 of FIG. 1. Data lines 270, 271, and 272 in FIG. 2 can correspond to data lines 170 of FIG. 1. Buffer circuits 220, 221, and 222 in FIG. 2 can be part of buffer circuitry (not shown) of memory device 200 that can correspond to buffer circuitry 120 of FIG. 1. Memory device 200 can include other elements of a memory device that are omitted from FIG. 2 for simplicity. For example, memory device 200 can include a control unit similar to (or the same as) control unit 118 of FIG. 1 to perform memory operations (e.g., read, write, erase, and sampling operations).

Each of blocks 290 and 291 can include sub-blocks. For example, block 290 can include sub-blocks $290_0$, $290_1$, $290_2$, and $290_3$. For simplicity, details (e.g., sub-blocks and memory cells) of block 291 are not shown in FIG. 2. Each of sub-blocks $290_0$, $290_1$, $290_2$, and $290_3$ can include a number of memory cells among memory cells 210, 211, 212, and 213. Each of blocks 290 and 291 can be independently accessed during an operation (e.g., read, write, or erase operation) of memory device 200. Each sub-block (e.g., each of sub-blocks $290_0$, $290_1$, $290_2$, and $290_3$) in a block (e.g., block 290) can be independently accessed (e.g., access one at a time) during an operation (e.g., read, write, or erase operation) of memory device 200. A sub-block (e.g., a selected sub-block) among sub-blocks of a selected block can be selected to store information during a particular program event (e.g., a write operation) while the rest of the sub-blocks of the selected block can be unselected during that particular program event. For example, sub-block $290_0$ can be selected to store information during a particular program event while sub-blocks $290_1$, $290_2$, and $290_3$ are unselected (not selected) to store information during that particular program event.

In FIG. 2, buffer circuits 220, 221, and 222 can operate to determine (e.g., by sensing the signals on data lines 270, 271, and 272, respectively) the value of information read (e.g., sensed) from memory cells 210, 211, 212, and 213 during a read operation. Buffer circuits 220, 221, and 222 in FIG. 2 can also operate to determine the value of information to be stored in memory cells 210, 211, 212, and 213 during a write operation. Further, buffer circuits 220, 221, and 222 in FIG. 2 can also operate (e.g., during a write verify stage of a write operation) to determine (e.g., by sensing the signals on data lines 270, 271, and 272, respectively) whether the threshold voltage of a particular memory cell (or memory cells) among memory cells 210, 211, 212, and 213 reaches a target threshold voltage.

As shown in FIG. 2, data lines 270, 271, and 272 can carry signals BL0, BL1, and BL2, respectively. Each of data lines 270, 271, and 272 can be structured as a conductive line of memory device 200. Memory device 200 can include line 299 that can carry a signal (e.g., a source line signal) SRC. Line 299 can be structured as a conductive line or a conductive plate of memory device 200. Line 299 can be common conductive line (e.g., a common source line or a common source plate) of sub-blocks $290_0$, $290_1$, $290_2$, and $290_3$. Line 299 can be coupled to a ground connection of memory device 200.

As shown in FIG. 2, access lines 250a, 251a, 252a, and 253a can carry corresponding signals (e.g., word line signals) WL0, WL1, WL2, and WL3. Memory device 200 can include control gates 250b, 251b, 252b, and 253b that can be part of access lines 250a, 251a, 252a, and 253a, respectively. FIG. 2 shows four access lines 250a, 251a, 252a, and 253a and three data lines 270, 271, and 272 as an example. The number of such access lines and data lines can vary.

Memory device 200 can include select transistors 261, 262, 263, and 264 (bottom part of FIG. 2) and select transistors 265, 266, 267, and 268 (top part of FIG. 2). Memory cells 210, 211, 212, and 213 can be arranged in memory cell strings, such as memory cell strings $230_0$, $230_1$, $230_2$, $230_3$, $231_0$, $231_1$, $231_2$, $231_3$, $232_0$, $232_1$, $232_2$, and $232_3$. For brevity, these memory cell strings are collectively referred to as memory cell strings $230_0$ through $232_3$. Each of memory cells 210, 211, 212, and 213 can be configured as a single level cell or a multi-level cell.

Each of memory cell strings $230_0$ through $232_3$ can be coupled to one of data lines 270, 271, and 272 through one of select transistors 265, 266, 267, and 268. Each of memory cell strings $230_0$ through $232_3$ can also be coupled to line 299 through one of select transistors 261, 262, 263, and 264. For example, memory cell string $230_0$ can be coupled to data line 270 through select transistor 265 (directly over string $230_0$ and to line 299 through select transistor 261 (directly under string $230_0$). In another example, memory cell string $230_1$ can be coupled to data line 270 through select transistor 266

(directly over string $230_1$) and to line 299 through select transistor 262 (directly under string $230_1$). FIG. 2 shows an example of 12 memory cell strings $230_0$ through $232_3$ and four memory cells 210, 211, 212, and 213 in each memory cell string. The number of such memory cell strings and the number of memory cells in each memory cell string can vary.

As shown in FIG. 2, some memory cells (e.g., 212) of memory cell strings $230_0$ through $232_3$ can share the same control gate (e.g., 252b). Some other memory cells (e.g., 213) of memory cell strings $230_0$ through $232_3$ can share another control gate (e.g., 253b). Each of control gates 250b, 251b, 252b, and 253b can be structured as a single conductive plate. Thus, in the example shown in FIG. 2, memory device 200 can include four conductive plates that form four control gates 250b, 251b, 252b, and 253b.

Select transistors 261, 262, 263, and 264 can share the same gate 280b. Gate 280b can form part of a select line (e.g., source select line) 280a of memory device 200. Select transistors 261, 262, 263, and 264 can be controlled (e.g., turned on or turned off) by the same signal, such as an SGS signal (e.g., source select gate signal) applied to select line 280a. During a memory operation, such as a read or write operation, select transistors 261, 262, 263, and 264 can be turned on (e.g., by activating SGS signal) to couple memory cell strings $230_0$ through $232_3$ to line 299. Select transistors 261, 262, 263, and 264 can be turned off (e.g., by deactivating the SGS signal) to decouple the memory cell strings $230_0$ through $232_3$ from line 299.

Select transistors 265, 266, 267, and 268 can include separate gates (e.g., separate drain select gates) 285b, 286b, 287b, and 288b. However, select transistors 265 can share the same gate 285b. Select transistors 266 can share the same gate 286b. Select transistors 267 can share the same gate 287b. Select transistors 268 can share the same gate 288b. Gates 285b, 286b, 287b, and 288b can form part of select lines (e.g., drain select lines) 285a, 286a, 287a, and 288a, respectively, of memory device 200.

Select transistors 265, 266, 267, and 268 can be controlled (e.g., turned on or turned off) by corresponding signals SGD0, SGD1, SGD2, and SGD3 (e.g., drain select gate signals) during a memory operation (e.g., a read or write operation) in order to selectively couple memory cell strings $230_0$ through $232_3$ to their respective data lines 270, 271, and 272. During a memory operation (e.g., a read or write operation), only one of the signals SGD0, SGD1, SGD2, and SGD3 can be activated at a time (e.g., sequentially activated).

For example, during a write operation of storing information in a selected memory cell of memory cell strings $230_0$, $231_0$, or $232_0$, signal SGD0 can be activated to turn on select transistors 265 and couple memory cell strings $230_0$, $231_0$, and $232_0$ to data lines 270, 271, and 272, respectively. Signals SGD1, SGD2, and SGD3 can be deactivated (while signal SGD0 is activated) to decouple memory cell strings $230_1$, $231_1$, $232_1$, $230_2$, $231_2$, $232_2$, $230_3$, $231_3$, and $232_3$ from data lines 270, 271, and 272.

In another example, during a write operation of storing information in a selected memory cell of memory cell strings $230_1$, $231_1$, or $232_1$, signal SGD1 can be activated to turn on select transistors 266 and couple memory cell strings $230_1$, $231_1$, and $232_1$ to data lines 270, 271, and 272, respectively. Signals SGD0, SGD2, and SGD3 can be deactivated (while signal SGD1 is activated) to decouple memory cell strings $230_0$, $231_0$, $232_0$, $230_2$, $231_2$, $232_2$, $230_3$, $231_3$, and $232_3$ from data lines 270, 271, and 272.

Figure 9:
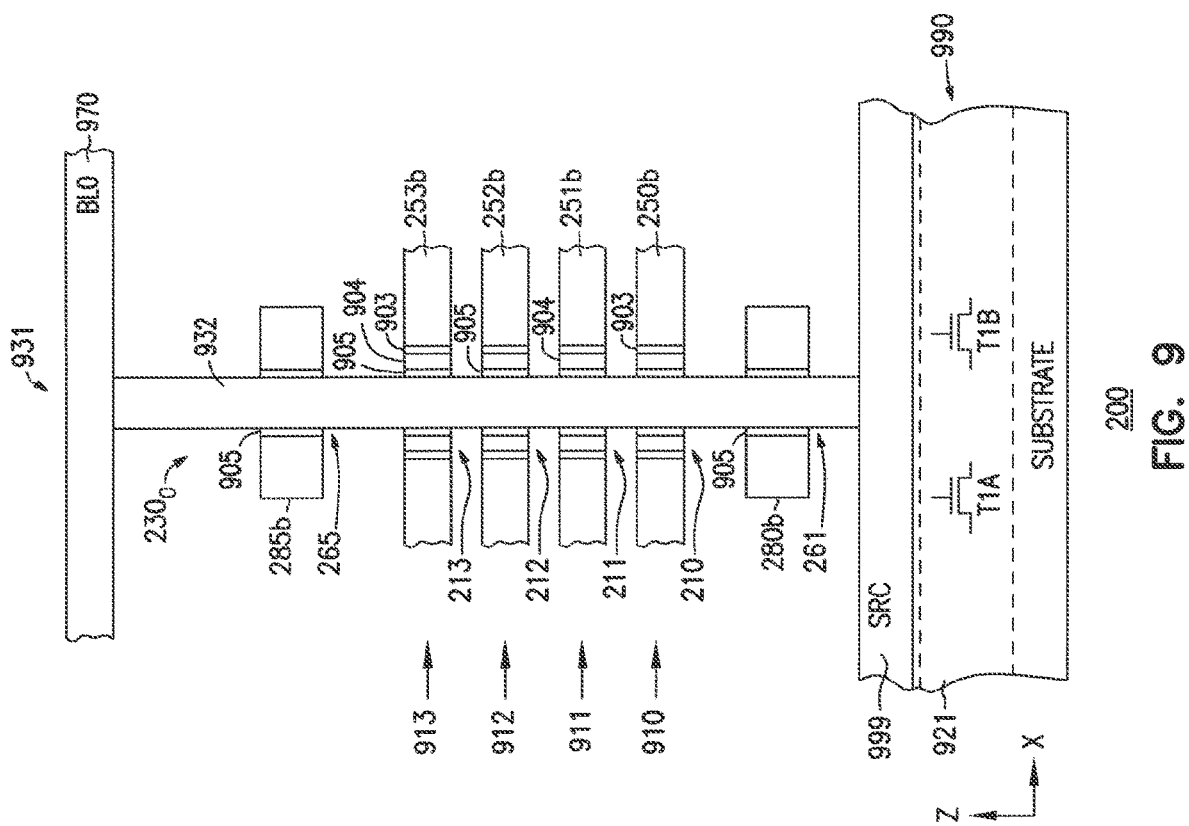
FIG. 9 shows a side view of a structure of a portion of the memory device of FIG. 2, according to some embodiments described herein.

Memory cells 210, 211, 212, and 213 can be physically located in multiple levels of memory device 200, such that memory cells 210, 211, 212, and 213 in the same memory cell string can be stacked one over another (e.g., vertical stacked memory cells) in multiple levels of memory device 200. FIG. 9 shows example structures of memory devices having stacked memory cells that can correspond to memory cells 210, 211, 212, and 213 of memory device 200. FIG. 2 shows directions X, Y, and Z that can be relative to the physical directions (e.g., dimensions) of the structure of memory device 200. For example, the Z-direction can be a direction perpendicular to (e.g., vertical direction relative to) a substrate (e.g., a semiconductor substrate) of memory device 200. The Z-direction is perpendicular to the X-direction and Y-direction (e.g., the Z-direction is perpendicular to an X-Y plane of memory device 100).

FIG. 2 shows an example where each of sub-blocks $290_0$, $290_1$, $290_2$, and $290_3$ includes one memory cell string in the X-direction and three memory cell strings in the Y-direction. For example, as shown in FIG. 2, sub-block 290 includes one memory cell string (e.g., memory cell string $230_0$, $230_1$, or $230_2$) in the X-direction and three memory cell strings (e.g., memory cell strings $230_0$, $230_1$, and $230_2$) in the Y-direction. However, each of sub-blocks $290_0$, $290_1$, $290_2$, and $290_3$ can include different numbers of memory cell strings in the X-direction and Y-direction.

The value of information stored in a particular memory cell among memory cells 210, 211, 212, and 213 of memory device 200 can be based on the threshold voltage of that particular memory cell. Each of memory cells 210, 211, 212, and 213 can be configured to store at most one bit (e.g., only a single bit) or multiple bits (e.g., two bits, three bits, or more than three bits) of information.

As described below with reference to FIG. 4 through FIG. 8, memory device 200 can perform a sampling operation on a portion of memory cells in each of blocks 290 and 291. Based on the result of the sampling operation in a program event, memory device 200 can adjust the value of a start voltage in a subsequent program event in memory device 200.

Figure 3:
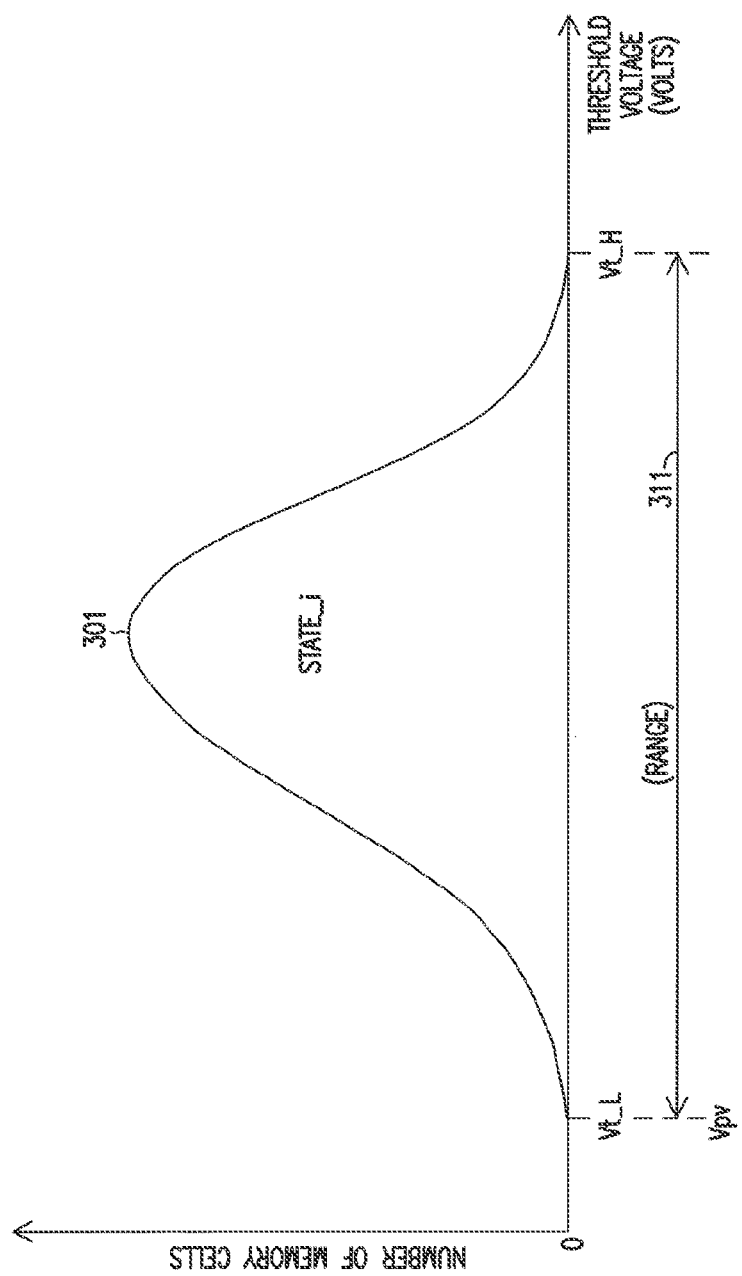
FIG. 3 shows a curve illustrating threshold voltages of a threshold voltage range (e.g., distributions) for a number of memory cells of the memory device of FIG. 2, according to some embodiments described herein.

FIG. 3 shows a curve 301 illustrating threshold voltages of a threshold voltage range (e.g., distribution) 311 for a number of memory cells of memory device 200, according to some embodiments described herein. Curve 301 can represent a normal distribution of threshold voltages within threshold voltage range 311 for a number of memory cells of memory device 200. As shown in FIG. 3, threshold voltage range 311 can include threshold voltages ranging from a voltage Vt_L to a voltage Vt_H. Voltages Vt_L and Vt_H can be lower and higher threshold voltage limits, respectively, of threshold voltage range 311.

In FIG. 3, threshold voltage range 311 can correspond (e.g., can be preassigned) to a state (e.g., labeled as "STATE_i") of memory cells 210, 211, 212, and 213 of memory device 200. The state STATE_i can present a value (e.g., binary value) of a single bit (e.g., "0" or "1"), two bits (e.g., "01", "10", or another value of two-bits), three bits (e.g., "001", "110", or another value of three bits), or a value of more than three bits of information stored in a memory cell of memory device 200.

During a program event of a write operation, a selected memory cell (or selected memory cells) among memory cells 210, 211, 212, and 213 of memory device 200 can be programmed to have a target threshold voltage (corresponding to state STATE_i) within threshold voltage range 311. As an example, if memory cells 210, 211, 212, and 213 of memory device 200 are configured as a one-bit per memory cell (e.g., SLC), then a selected memory cell among memory cells 210, 211, 212, and 213 of memory device 200 can be programmed to have a target threshold voltage within threshold voltage range 311 to represent a value (e.g., "0" or "1") of one bit. In another example, if memory cells 210, 211, 212, and 213 of memory device 200 are configured as a two-bit per memory cell (e.g., MLC), then a selected memory cell among memory cells 210, 211, 212, and 213 of memory device 200 can be programmed to have a target threshold voltage within threshold voltage range 311 to represent a value of two bits. In another example, if memory cells 210, 211, 212, and 213 of memory device 200 are configured as a three-bit per memory cell (e.g., TLC), then a selected memory cell among memory cells 210, 211, 212, and 213 of memory device 200 can be programmed to have a target threshold voltage within threshold voltage range 311 to represent a value of three bits.

During a program event (e.g., part of a write operation), a voltage (e.g., program voltage) Vpgm_i (not shown in FIG. 2 and FIG. 3) can be applied to a selected access line among access lines 250a, 251a, 252a, and 253a (FIG. 2) to cause a selected memory cell among memory cells 210, 211, 212, and 213 of memory device 200 to have a target threshold voltage within threshold voltage range 311. A write operation (e.g., which includes a program event) of memory device 200 can include a write stage and a write verify stage. Memory device 200 can store (e.g., program) information in a selected memory cell during a write stage, and determine (e.g., verify) whether the threshold voltage of the selected memory cell reaches a target threshold voltage in a verify stage. Memory device 200 can repeat the write stage and the write verify stage of a write operation until the threshold voltage of the selected memory cell reaches a target threshold voltage.

In FIG. 3, voltage Vpv can present a program verify voltage that memory device 200 can use to determine whether the selected memory cell during the program event reaches a target threshold voltage. Memory device 200 can compare the threshold voltage of the selected memory cell with voltage Vpv. Memory device 200 can determine that the threshold voltage of the selected memory cell reaches a target threshold voltage when the threshold voltage of the selected memory cell is greater than voltage Vpv. As an example, the value of voltage Vpv (e.g., program verify voltage) can be from 1V to 5V, and the value of voltage Vpgm_i (e.g., programing voltage) can be from 15V to 20V.

Threshold voltage range 311 may shift (e.g., due to cycling). Memory device 200 can perform a sampling operation to counter (e.g., minimize) the effect of the shift in threshold voltage range 311.

Figure 4:
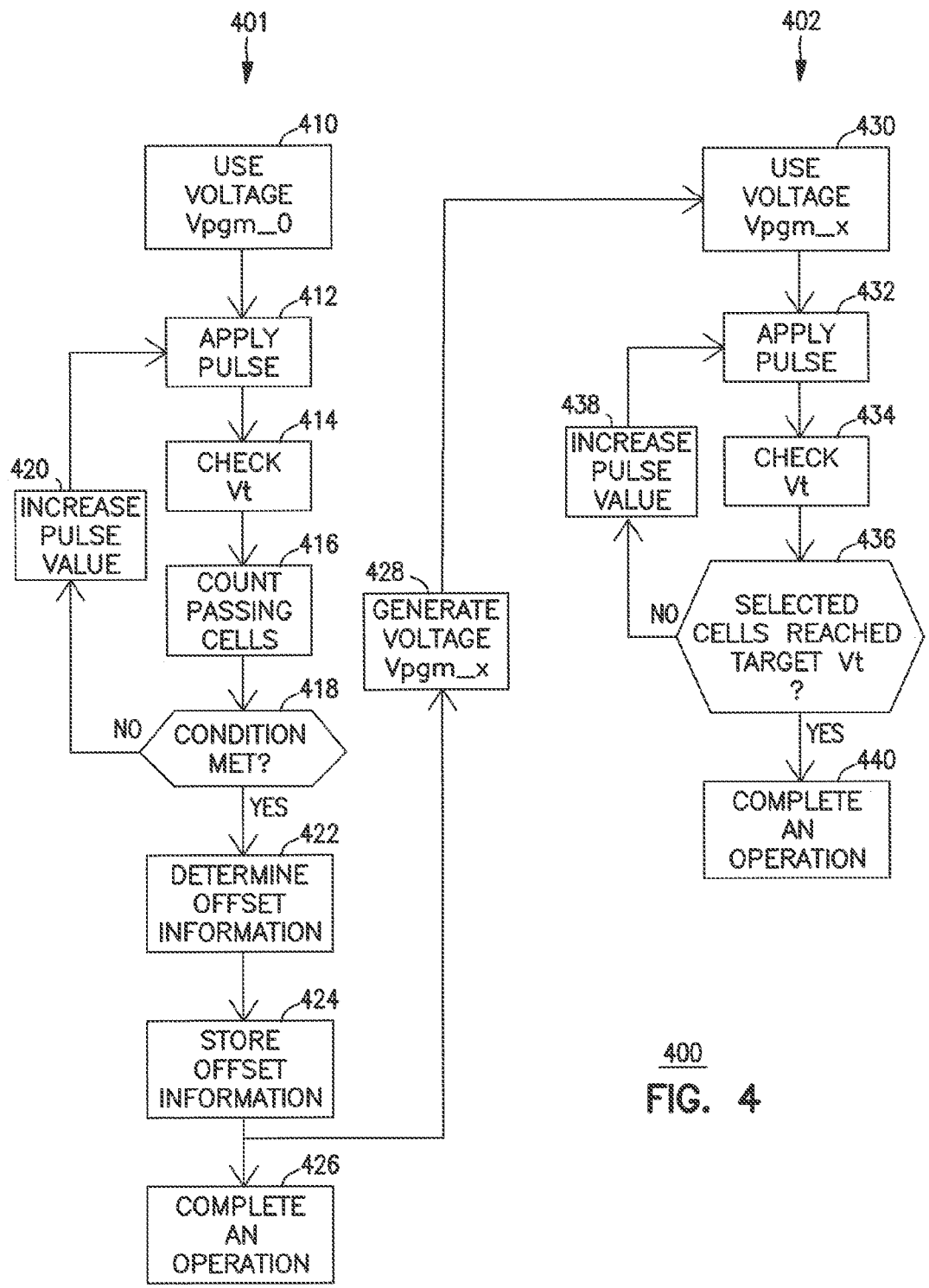
FIG. 4 is a flowchart for a method of performing a sampling operation during an operation in a program event, according to some embodiments described herein.

FIG. 4 is a flowchart for a method 400 of performing a sampling operation in one of program events 401 and 402, according to some embodiments described herein. Method 400 can be performed by a memory device such as memory device 100 of FIG. 1 or memory device 200 of FIG. 2. At least part of method 400 (e.g., part of method 400 or the entire method 400) can be performed (e.g., controlled) by a control unit of the memory device used in method 400. Such a control unit can be similar to (or the same as) control unit 118 of FIG. 1. The control unit of the memory device used in method 400 can be configured to include specific firmware, hardware, or software or any combination of firmware, hardware, and software to perform method 400. For simplicity, the memory device described in method 400 refers to memory device 200. However, the memory device described in method 400 can also refer to memory device 100 or another memory device different from memory devices 100 and 200.

Program events 401 and 402 of method 400 can be performed in different sub-blocks of memory device 200. For example, program event 401 can be performed in sub-block $290_0$, and program event 402 can be performed in sub-block $290_1$, $290_2$, or $290_3$. As described in more detail below, program event 401 can include a sampling operation to sample threshold voltages of a portion of memory cells of a sub-block (e.g., sub-block $290_0$). The sampling operation can provide a sampling result that can be used to predict a threshold voltage range of the portion of memory cells. Based on the sampling result, memory device 200 can adjust a voltage (e.g., start program voltage) used during a program event (e.g., in write operation) performed on memory cells of another sub-block (e.g., each of sub-blocks $290_1$, $290_2$, and $290_3$).

As shown in FIG. 4, activity 410 in program event 401 can include using a voltage Vpgm_0 (e.g., default program voltage). The value of voltage Vpgm_0 can be based on the structures (e.g., intrinsic properties) of the memory cells of memory device 200. As an example, the value of voltage Vpgm_0 can be less than the value of voltage Vpgm_i (e.g., a program voltage) in FIG. 3 (e.g., 0<Vpgm_0<Vpgm_i). Alternatively, the value of voltage Vpgm_0 can be equal to the value of voltage Vpgm_i (e.g., Vpgm_0=Vpgm_i). As described above with reference to FIG. 3, during a program event (e.g., part of a write operation), memory device 200 can use voltage Vpgm_i to cause a selected memory cell of memory device 200 to have a target threshold voltage within threshold voltage range 311 (e.g., a target threshold voltage from voltage Vt_L to voltage Vt_H).

In method 400 in FIG. 4, activity 410 can be performed at the beginning (the start) of program event 401. Thus, voltage Vpgm_0 can be a start voltage (e.g., initial voltage) of program event 401. Alternatively (e.g., in alternative configuration of memory device 200), activity 410 can be at performed at some point in time after the beginning of program event 401. Thus, voltage Vpgm_0 may not be a start voltage (e.g., may not be an initial voltage) of program event 401.

In method 400, the value of voltage Vpgm_0 used in activity 410 can be stored in a memory structure (e.g., in control registers) of memory device 200 before program event 401 begins. The memory structure can be part of the control unit (or can be outside the control unit) of memory device 200. The memory structure can include control registers that can be similar to or the same as control registers 121 of FIG. 1.

In FIG. 4, activity 412 of method 400 can include applying a pulse (e.g., a programming voltage pulse) to an access line (e.g., selected access line) of a sub-block (e.g., selected sub-block) of memory device 200. The control unit of memory device 200 can initiate applying the pulse in activity 412. The pulse can include an amplitude V_pulse having a value (e.g., in volt unit) based on the value of voltage Vpgm_0. For example, the amplitude of the pulse in activity 412 can be the same as (equal to) voltage Vpgm_0 (e.g., V_pulse=Vpgm_0).

Activity 412 can be similar to (or the same as) part of an operation (e.g., a write stage of a write operation) of memory device 200. For example, the pulse in activity 412 can include a pulse applied to a selected access line (e.g., one of access lines 250a through 253a in FIG. 2) of memory device 200 during a write operation of memory device 200 to store information in selected memory cells (of a selected sub-block) coupled to the selected access line of memory device 200. Applying the pulse in activity 412 to an access line of memory device 200 can change (e.g., increase) the threshold voltage of selected memory cells of a selected sub-block of memory device 200 that are coupled to the selected access line. For example, the access line (e.g., selected access line) in activity 412 can include access line 250*a* (FIG. 2), and sub-block 290$_0$ (FIG. 2) can be the selected sub-block. In this example, access lines 251*a*, 252*a*, and 253*a* (FIG. 2) can be unselected access lines and sub-blocks 290$_1$, 290$_2$, and 290$_3$ can be unselected sub-blocks. Thus, applying the pulse in activity 412 in this example can change the threshold voltage of memory cells 210 of sub-block 290$_0$ (selected sub-block).

Activity 414 of method 400 can include performing a stage (e.g., check threshold voltage (Vt) stage), which can be the same as a write verify stage of a write operation in memory device 200. The check Vt (check threshold voltage) stage in activity 414 can include determining (e.g., checking) whether the threshold voltage of selected memory cells (e.g., memory cells 210 in sub-block 290$_0$) is greater than a voltage PV_select (selected threshold voltage). Voltage PV_select can be based on a target threshold voltage in a target threshold voltage range of memory cells 210, 211, 212, and 213 of FIG. 2. For example, voltage PV_select used in check Vt stage in activity 414 can be the value of voltage Vpv (program verify voltage) of FIG. 3. Alternatively, voltage PV_select in activity 414 can be a value different from the value of voltage Vpv in FIG. 3. For example, FIG. 6 (described in detail below) shows an example for voltage PV_select used in activity 414.

In FIG. 4, activity 416 of method 400 can include counting a number of memory cells that have their threshold voltages greater than voltage PV_select. Count value P in activity 416 is the result of the sampling operation in program event 401. In activity 416, a count value P can be used to indicate (e.g., represent) the number (quantity) of memory cells that have their threshold voltage greater than voltage PV_select. Count value P can be set to (e.g., programed to be) zero (P=0) before the beginning of the sampling operation (e.g., before performing activity 410) in program event 401. Count value P may remain at zero (P=0) in activity 416 or may change to a positive number (e.g., P=1 or P>1), depending on the number of memory cells that have their threshold voltages greater than voltage PV_select (after the pulse is applied in activity 412). For example, count value P can remain at zero (P=0) in response to a determination from the counting performed in activity 416 that no memory cells have their threshold voltages greater than voltage PV_select. In another example, count value P can be greater than zero. Count value P can indicate a byte (or bytes) of memory cells. For example, count value P of 1 (P=1) can indicate that 8 memory cells (one byte of memory cells) among selected memory cells have their respective threshold voltages greater than voltage PV_select. In another example, count value P of 4 (P=4) can indicate that that 32 memory cells (eight bytes of memory cells) among selected memory cells have their respective threshold voltages greater than voltage PV_select.

Activity 418 can include determining whether a condition (e.g., a sampling criteria) is met (satisfied). The condition can be based on a relationship between count value P and a target count value T. As mentioned above, count value P indicates the number of memory cells that have their threshold voltages (Vt) greater than voltage PV_select. In activity 418, target count value T (e.g., a predetermined value) can be selected (e.g., selected by a user) and stored in memory device 200. Thus, target count value T is a known value before the beginning of the sampling operation (e.g., before performing activity 410) in program event 401.

For example, target count value T can be set to be at least one (e.g., T=1 or T>1). Target count value T can be stored in the memory device 200 before the beginning of the sampling operation (e.g., before performing activity 410) in program event 401. For example, the control unit of memory device 200 can be configured to include control registers (which can be similar to or the same as control registers 121 of FIG. 1) to store target count value T for the sampling operation described herein.

In activity 418, the condition is met (e.g., the condition is satisfied) if count value P is at least equal to target count value T (e.g., P=T or P>T). The control unit of memory device 200 can determine that the condition is met (e.g., the condition is satisfied) in response to count value P being greater than target count value T (e.g., P=T or P>T).

In activity 418, the condition is not met (e.g., the condition is unsatisfied) if count value P is less than target count value T (e.g., P<T). The control unit of memory device 200 can determine that the condition is not met (e.g., the condition is unsatisfied) in response to count value P being less than target count value T (e.g., P<T).

In FIG. 4, the label "NO" at activity 418 indicates that the condition in activity 418 is not met. In this case, method 400 can continue with activity 420. The label "YES" at activity 418 indicates that the condition in activity 418 is met. In this case, method 400 can continue with activity 422.

In an alternative configuration of memory device 200, target count value T can be omitted (e.g., not used). In such an alternative configuration, the condition in activity 418 is not met if count value P is less than one (e.g., P<1 (e.g., remain at zero)) and the condition in activity 418 is met if count value P is at least one (e.g., P=1 or P>1). Thus, in an alternative configuration of memory device 200, the condition in activity 418 is not met in response to a determination that count value P is less than one, and the condition in activity 418 is met in response to a determination that count value P is at least one.

In FIG. 4, activity 420 can include increasing the value of the pulse (which is applied in activity 412). Increasing the value of the pulse can include increasing the amplitude of the pulse by an increment amount (e.g., a voltage amount). For example, activity 420 can increase the amplitude of the pulse from V_pusle to V_pusle+V_delta, where delta V_delta is the increment amount (e.g., in volt unit). As an example, V_delta can have a value such that the value of the pulse (to V_pusle+V_delta) in a next program iteration (e.g., in a repeated program loop) can cause a threshold voltage of a selected memory cell to increase.

In FIG. 4, after activity 420 is performed, method 400 can perform a repeat sequence (e.g., a repeat loop) to repeat activities 412, 414, 416, and 420 at least one more time in response to the condition in activity 418 in the repeat sequence not being met. As mentioned above, method 400 can continue with activity 422 if the condition in activity 418 is met.

Activity 422 can include determining the value for information (e.g. offset voltage) V_offset. Information V_offset is the offset information that memory device 200 can use to adjust (e.g., increase or decrease) the value of a start voltage (e.g., voltage Vpgm_0) for a subsequent program event (e.g., program event 402).

In activity 422, memory device 200 can determine information V_offset based on count value P using a curve-fit model calculation or a lookup table calculation. A curve-fit model calculation and lookup table calculation are described below with reference to FIG. 6, FIG. 7, and FIG. 8 (after the description of FIG. 5).

In FIG. 4, activity 424 can include storing information V_offset (which was determined in activity 422). Memory device 200 can include memory circuitry to store information V_offset. The memory circuitry can be included as part of the control unit of memory device 200 or can be part of another component (e.g., in a memory array area outside the control unit) of memory device 200. As an example, the control unit of memory device 200 can include control registers (which can be similar to or the same as control registers 121 of FIG. 1). The control unit can be configured to store the value of information V_offset in the control registers.

Based on the stored information V_offset, memory device 200 can adjust voltage Vpgm_0 for a subsequent program event. Memory device 200 can adjust voltage Vpgm_0 by generating an adjusted voltage (e.g., voltage Vpgm_x, described below) that can be used as a start voltage (e.g., an initial programing voltage) for subsequent program event (e.g., program event 402).

As shown in FIG. 4, program event 401 can include activity 426, which can include completing an operation. The operation in activity 426 can be part of the write operation (which includes program event 401) to store information in selected memory cells among memory cells 210, 211, 212, and 213 in sub-block $290_0$. The information to be stored can include a page or multiple pages of information. As is known to those skilled in the art, a page of information in the context described herein can include a number of bits of information. Such a page can be a lower page, an upper page, and additional page (e.g., middle page or extra page). The selected memory cells in activity 426 can include the memory cells associated with activities 414 and 416. Completing the operation in activity 426 can include completing the operation of storing information (e.g., a page or multiple pages of information) in selected memory cells in sub-block $290_0$. Completing the operation in activity 426 can include changing threshold voltages of the selected memory cells in sub-block $290_0$ until the selected memory cells reach their respective target threshold voltages. The operation in activity 426 can be similar to part of the operation in program event 402 to store information in selected memory cells of a sub-block (e.g., sub-block $290_1$) that are different from selected memory cells in sub-block $290_0$.

As shown in FIG. 4, method 400 can include activity 428 to generate voltage Vpgm_x. Activity 428 can be part of program event 401 or part of program event 402. Activity 428 can generate voltage Vpgm_x based on based on information V_offset. Memory device 200 can determine311 fi the value of voltage Vpgm_x (e.g., by the control unit of memory device 200) in response to information V_offset and voltage Vpgm_0. Voltage Vpgm_x can be a function of information V_offset and voltage Vpgm_0 (e.g., default programming voltage). For example, voltage Vpgm_x can be greater than voltage Vpgm_0 by a voltage amount based on information V_offset (e.g., Vpgm_x=Vpgm_0+ V_offset). In another example, voltage Vpgm_x can be less than voltage Vpgm_0 (e.g., Vpgm_x=Vpgm_0−V_offset).

In activity 428 of FIG. 4, voltage Vpgm_x can be greater than voltage Vpgm_0 or less than voltage Vpgm_0 based on the difference between count value P (generated in activity 416) and target count value T (e.g., predetermined value). For example, voltage Vpgm_x can be greater than voltage Vpgm_0 (e.g., Vpgm_x=Vpgm_0+V_offset) based on a determination by memory device 200 that count value P is greater than target count value T (e.g., P>T) by a relatively small difference (e.g., P<T by a factor of at most 1). A higher voltage Vpgm_x relative to voltage Vpgm_0 (e.g., Vpgm_x=Vpgm_0+V_offset) allows a subsequent operation (e.g., program event 402) to be more aggressive to allow selected memory cells to reach their target threshold voltages in a relatively shorter time (in comparison to performing the subsequent operation using voltage Vpgm_0).

In another example, voltage Vpgm_x can be less than voltage Vpgm_0 (e.g., Vpgm_x=Vpgm_0−V_offset) based on a determination by memory device 200 that count value P is greater than target count value T (e.g., P>T) by a relatively large difference (e.g., P>T by a factor greater than 1). A lower Vpgm_x relative to voltage Vpgm_0 allows a subsequent operation (e.g., program event 402) to be less aggressive to prevent over-programming of selected memory cells in the subsequent operation (in comparison to performing the subsequent operation using voltage Vpgm_0). As described above, voltage Vpgm_x can be used as a start voltage in program event 402.

Program event 402 in method 400 can occur after information V_offset is calculated in program event 401 and before activity 426 (or after activity 426) of program event 401. As shown in FIG. 4, method 400 can include using voltage Vpgm_x in activity 430 of program event 402. Program event 402 can be a subsequent program event (which is performed after program event 401) performed on a sub-block (e.g., sub-block $290_1$, $290_2$, or $290_3$) of memory device 200 that can be different from the sub-block (e.g., sub-block $290_0$) on which program event 401 is performed.

Program event 402 can be part of a write operation to store information (e.g., user data) in selected memory cells among memory cells 210, 211, 212, and 213 in a sub-block (e.g., sub-block $290_1$, $290_2$, or $290_3$) of memory device 200. Memory device 200 may receive a command (e.g., a write command) to start program event 402. The command can be sent to memory device 200 from an external device (e.g., a processor or a memory controller).

In FIG. 4, activities 432, 434, 436, 438, and 440 can be part of the write operation (which includes program event 402) to store information in selected memory cells among memory cells 210, 211, 212, and 213 of memory device 200. Memory device 200 can perform activities 432, 434, 436, 438, and 440 to change the threshold voltages of the selected memory cells until the selected memory cells reach their respective target threshold voltages.

Activity 430 can be performed at the start (the beginning) of program event 402. Thus, voltage Vpgm_x can be a start voltage (e.g., initial voltage) of program event 402. Alternatively (e.g., in alternative configuration of memory device 200), activity 430 can be performed at some point in time after the beginning of program event 402. Thus, voltage Vpgm_x may not be a start voltage (e.g., may not be an initial voltage) of program event 402.

As shown in FIG. 4, activity 432 can include applying a pulse (e.g., a programming voltage pulse) to an access line of a sub-block of memory device 200. The access line in activity 432 can include the access line coupled to selected memory cells of memory device 200 that are selected to store information in program event 402. For example, the access line in activity 432 can include access line 250a of sub-block $290_1$ if memory cells 210 of sub-block $290_1$ are selected to store information in program event 402. In another example, the access line in activity 432 can include access line 251a of sub-block 290₁ if memory cells 211 of sub-block 290₁ are selected to store information in program event 402.

The pulse in activity 432 can include an amplitude V_pulse_x having a value (e.g., in volt unit) based on the value of voltage Vpgm_x. For example, the amplitude of the pulse in activity 432 can be equal to (the same as) voltage Vpgm_x (e.g., V_pulse_x=Vpgm_x). In comparison with activity 412, the initial pulse in activity 432 can have an amplitude greater than the amplitude of an initial pulse in activity 412. For example, each of activities 412 and 432 can apply a sequence of pulses (multiple pulses) to an access line in which the pulses include an initial pulse (e.g., first pulse in the sequence) and subsequent pulses after the initial pulse. In comparing activity 432 with activity 412, the amplitude (e.g., amplitude V_pulse_x) of the initial pulse in activity 432 can be greater than the amplitude (e.g., amplitude V_pulse_0) of the initial pulse in activity 412.

Activity 434 of method 400 can include performing a write verify stage (check Vt stage). Performing the write verify stage can include determining (e.g., checking) whether the threshold voltage (Vt) of the memory cells coupled to the selected access line (at which the pulse in activity 432 is applied) reaches a target threshold voltage (target Vt). As described above, the target Vt in a memory cell of memory device 200 can represent the value of information to be stored in the selected memory cells. For example, the target Vt in activity 434 can be a threshold voltage within threshold voltage range 311 in FIG. 3. In this example, activity 434 can include determining (e.g., comparing) whether the threshold voltage of each of the selected memory cells is greater than voltage Vpv (e.g., program verify voltage).

Activity 436 of method 400 can include determining whether all of the selected memory cells reach their respective target threshold voltages. In FIG. 4, the label "NO" at activity 436 indicates that fewer than all (not all) of the selected memory cells reach their respective target threshold voltages. In this case, method 400 can continue with activity 438. The label "YES" at activity 436 indicates that all of the selected memory cells reach their respective target threshold voltages. In this case, method 400 can continue with activity 440.

Activity 438 can include increasing the value of the pulse (which is applied in activity 432). Increasing the value of the pulse can include increasing the amplitude of the pulse by an increment amount (e.g., a voltage amount). For example, activity 438 can increase the amplitude of the pulse from V_pulse_x to V_pulse_x+V_delta_x, where V_delta_x is the increment amount (e.g., in volt unit). Increment amount V_delta_x can be the same as (equal to) or different from (unequal to) increment amount V_delta (described above in activity 420).

After activity 438 is performed, method 400 can perform a repeat sequence (e.g., a repeat loop) to repeat activities 432, 434, and 436 at least one more time until all of the selected memory cells reach their respective target threshold voltages. As mentioned above, method 400 can continue with activity 440 if all of the selected memory cells reach their respective target threshold voltages.

Activity 440 can include completing an operation if all of the selected memory cells reach their respective target threshold voltages. The operation in activity 440 can be part of the write operation that includes program event 402.

Method 400 can repeat program event 402 as part of another write operation for storing information in additional selected memory cells of memory device 200. The additional memory cells in a repeated program event 402 can be included in a sub-block (e.g., sub-block 290₁, 290₂, or 290₃) that is different from the sub-block (e.g., sub-block 290₀) on which program event 402 is performed. Memory device 200 can use the same voltage Vpgm_x (e.g., in an initial pulse) in a repeated program event 402 (or in multiple occurrences of repeated program event 402).

Method 400 as described above can include fewer or more activities relative to the activities shown in FIG. 4. For example, program event 402 of method 400 can include other activities of a write operation of a memory device (e.g., memory device 200) that are omitted from FIG. 4 for simplicity.

In FIG. 4, memory device 200 can start the sampling operation (which is part of program event 401) without intervention from an external device. Examples of such an external device include a memory controller, a processor (e.g., a processor included in a host), and other controllers external to memory device 200. For example, memory device 200 can start the sampling operation in program event 401 (e.g., at activity 410) as part of a write operation of memory device 200 without receiving a specific command to start the sampling operation from the external device. Alternatively (or additionally), memory device 200 can start the sampling operation in program event 401 in response to a specific command (e.g., a specific command to start the sampling operation from an external device (e.g., a memory controller or a processor).

As described above, the sampling operation (to generate offset information) in the program event 401 can be part of a write operation (e.g., a write operation to store user information) performed on sub-block 290₀. Alternatively, the sampling operation can be an independent operation initiated by memory device 200 without being part of a write operation (e.g., a write operation to store user information) performed on sub-block 290₀.

Memory device 200 can be configured to perform the sampling operation at periodic intervals or non-periodic intervals. For example, memory device 200 can perform the sampling operation after a number (e.g., a predetermined number) of write operations, erase operations, read operations, or any combination of any number of write operations, erase operations, and read operations. In another example, memory device 200 can perform the sampling operation after a power failure or after a predetermine event (or events) different from a power failure event.

Figure 5:
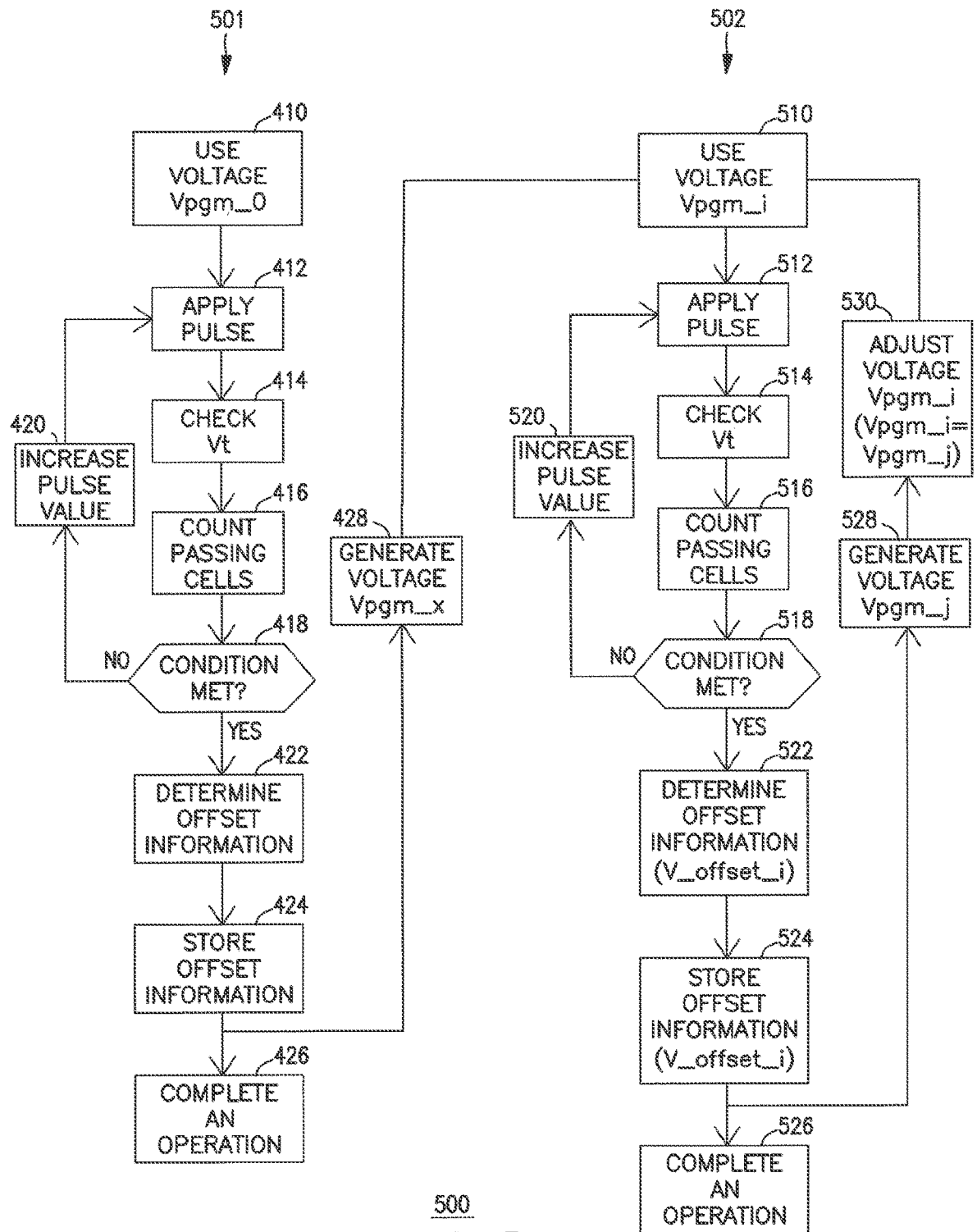
FIG. 5 is a flow chart for a method of performing multiple sampling operations during operations of respective program events, according to some embodiments described herein.

FIG. 5 is a flow chart for a method 500 of performing multiple sampling operations during operations of program events 501 and 502, according to some embodiments described herein. Method 500 can be performed by a memory device such as memory device 100 of FIG. 1 or memory device 200 of FIG. 2. Part of method 500 (e.g., or the entire method) can be performed (e.g., controlled) by a control unit of the memory device used in method 500. Such a control unit can be similar to (or the same as) control unit 118 of FIG. 1. The control unit of the memory device used in method 500 can be configured to include specific firmware, hardware, or software or any combination of firmware, hardware, and software to perform method 500. For simplicity, the memory device described in method 500 refers to memory device 200. However, the memory device described in method 500 can also refer to memory device 100 or another memory device different from memory devices 100 and 200.

Memory device 200 can be configured to perform either method 400 (FIG. 4) or method 500 (FIG. 5). Alternatively, memory device 200 can be configured to perform both methods 400 and 500 at different times.

Method 500 can include activities (e.g., operations) that are similar to (or the same as) some of the activities of method 400. Thus, for simplicity, similar or the same activities between method 400 and method 500 are given the same labels and are not repeated. Differences between method 400 (FIG. 4) and method 500 (FIG. 5) include multiple sampling operations (e.g., continuous sampling operations) to generate multiple adjusted voltages (e.g., more than one start voltage) for use in different sub-blocks of memory device 200. For example, as described above with reference to FIG. 4, memory device 200 can generate an adjusted voltage (e.g., Vpgm_x) based on a sampling operation (e.g., based on a single sampling operation) of memory cells in a sub-block of a block. Then, memory device 200 can use the adjusted voltage as a start voltage in another sub-block or in the rest of the sub-blocks of the block.

In FIG. 5, memory device 200 can use method 500 to generate multiple adjusted voltages (e.g., multiple start voltages) based on multiple respective sampling operations (e.g., based on continuous sampling operations). Then, memory device 200 can use the adjusted voltages as start voltages in another sub-block or in the rest of the sub-blocks of the block.

As shown in FIG. 5, program event 501 can include activities that can be the same as the activities of program event 401 of method 400 in FIG. 4. As described above with reference to FIG. 4, program event 401 can include a sampling operation to determine (e.g., calculate) information V_offset, which can be used to generate voltage Vpgm_x. Thus, program event 501 in FIG. 5 can generate voltage Vpgm_x in ways described above with reference to program event 401 of method 400 in FIG. 4. Voltage Vpgm_x can be used as a start voltage for program event 502.

In FIG. 5, program events 501 and 502 can be performed in different sub-blocks of memory device 200. For example, program event 501 can be performed in sub-block $290_0$, and program event 502 can be performed in sub-blocks $290_1$, $290_2$, or $290_3$ at different times. In this example, program event 501 can include a sampling operation to sample threshold voltages of a portion of memory cells of a sub-block among sub-blocks $290_0$. The result of the sampling operation from sub-block $290_0$ can be used to adjust a start voltage for sub-blocks $290_1$. Program event 502 can include a sampling operation to sample threshold voltages of a portion of memory cells of a sub-block among sub-blocks $290_1$. The result of the sampling operation from sub-block $290_1$ can be used to adjust a start voltage for sub-blocks $290_2$. Program event 502 can include a sampling operation to sample threshold voltages of a portion of memory cells of a sub-block among sub-blocks $290_2$. The result of the sampling operation from sub-block $290_2$ can be used to adjust a start voltage for sub-blocks $290_3$.

Alternatively, program events 501 and 502 can be performed in the same sub-block of memory device 200. However, program event 501 can be performed on memory cells coupled to different access lines of the sub-block. For example, program event 501 can be performed on memory cells in sub-block $290_0$ coupled to access line 250a (FIG. 2) and program event 502 can be performed on memory cells in sub-block $290_0$ coupled to access line 251a (FIG. 2). A first repeat of program event 502 can be performed on memory cells in sub-block $290_2$. A second repeat of program event 502 can be performed on memory cells in sub-block $290_2$.

The result of the sampling operation performed on memory cells coupled to a particular access line (e.g., access line 250a in FIG. 2) can be used to adjust a start voltage of memory cells of another sub-block that are coupled to that particular access line (e.g., access line 250a). For example, the result of the sampling operation performed on memory cells coupled to access line 250a of sub-block $290_0$ can be used to adjust a start voltage for memory cells coupled to access line 250a in each of sub-blocks $290_1$, $290_2$, and $290_3$. In another example, the result of the sampling operation performed on memory cells coupled to access line 251a of sub-block $290_0$ can be used to adjust a start voltage for memory cells coupled to access line 251a in each of sub-blocks $290_1$, $290_2$, and $290_3$. In another example, the result of the sampling operation performed on memory cells coupled to access line 252a of sub-block $290_0$ can be used to adjust a start voltage for memory cells coupled to access line 252a in each of sub-blocks $290_1$, $290_2$, and $290_3$. In another example, the result of the sampling operation performed on memory cells coupled to access line 253a of sub-block $290_0$ can be used to adjust a start voltage for memory cells coupled to access line 253a in each of sub-blocks $290_1$, $290_2$, and $290_3$.

As shown in FIG. 5, program event 502 can include using a voltage Vpgm_i in activity 510. Voltage Vpgm_i can be the same as voltage Vpgm_x generated based on a sampling operation in program event 501 (e.g., performed on sub-block $290_0$). Voltage Vpgm_i can be adjusted each time program event 502 is performed. As mentioned above, method 500 can include multiple sampling operations to generate multiple start voltages. Activity 510 can be the beginning of a sampling operation in program event 502 to determine offset information to adjust a start voltage of a subsequent event. Other activities in program event 502 can be similar to that of activities in program event 501.

For example, activities 514, 516, 518, 520, 522, and 524 can be similar to activities 414, 416, 418, 420, 422, and 424, respectively, of program event 401 (FIG. 4). Activities 514, 516, 518, 520, 522, and 524 can determine information V_offset_i (offset information) and store information V_offset_i.

Based on the stored information V_offset_i, memory device 200 can adjust voltage Vpgm_i for a subsequent program event. Memory device 200 can adjust voltage Vpgm_i by generating an adjusted voltage (e.g., voltage Vpgm_j, described below) that can be used as a start voltage (e.g., an initial programing voltage) for a subsequent program event (e.g., a repeat of program event 502).

As shown in FIG. 5, program event 502 can include activity 526, which can include completing an operation. The operation in activity 526 can be part of the write operation that includes program event 502 to store information (e.g., a page or multiples of information) in selected memory cells among memory cells 210, 211, 212, and 213 in a selected sub-block among sub-blocks $290_1$, $290_2$, and $290_3$. Thus, the operation in activity 426 can include changing threshold voltages of the selected memory cells in the selected sub-block until the selected memory cells reach their respective target threshold voltages.

As shown in FIG. 5, method 500 can include activity 528 to generate voltage Vpgm_j (e.g., adjusted voltage). Activity 528 can generate voltage Vpgm_j based on information V_offset_i. Vpgm_j is determined (e.g., by the control unit of memory device 200) in response to information V_offset_j and voltage Vpgm_j. Voltage Vpgm_j can be a function of information V_offset_i and voltage Vpgm_i. For example, voltage Vpgm_j can be greater than voltage Vpgm_i by a voltage amount based on information V_offset_i (e.g., Vpgm_j=Vpgm_i+V_offset_i). In another example, voltage Vpgm_j can be less than voltage Vpgm_i by a voltage amount based on information V_offset_i (e.g., Vpgm_j=Vpgm_i−V_offset_i).

As shown in FIG. 5, method 500 can include activity 530 to adjust voltage Vpgm_i that can be used as a start voltage for a subsequent program event (e.g., a repeat of program event 502). For example, before program event 502 is repeated on selected memory cells of a different sub-block (or alternatively, on selected memory cells coupled to a different access line), activity 530 can adjust voltage Vpgm_i by replacing (e.g., updating) voltage Vpgm_i with voltage Vpgm_j. Thus, in activity 510 of a repeated program event 502, voltage Vpgm_i can be replaced by voltage Vpgm_j.

In a sampling operation in program event 502 in a particular sub-block (e.g., sub-block $290_0$), memory device 200 can sample selected memory cells of that particular sub-block coupled to access line 250a. Based on the results of the sampling operation, memory device 200 can generate information V_offset_0 and voltage Vpgm_0' (e.g., adjusted voltage). Vpgm_0' is determined (e.g., by the control unit of memory device 200) in response to information V_offset_0 and voltage Vpgm_x. Voltage Vpgm_0' can be based on (e.g., a function of) information V_offset_0 and voltage Vpgm_x. For example, Vpgm_0'=Vpgm_x+V_offset_0, or Vpgm_0'=Vpgm_x−V_offset_0. Memory device 200 can use voltage Vpgm_0' as a start voltage for memory cells of the particular sub-block that are coupled to another access line (e.g., access line 251a in FIG. 2).

In another example, in a sampling operation in another program event 502 (e.g., a first repeat program event 502) in a particular sub-block (e.g., sub-block $290_0$), memory device 200 can sample selected memory cells (of that particular sub-block) coupled to access line 251a. Based on the results of the sampling operation, memory device 200 can generate offset information V_offset_1 and voltage Vpgm_1 (e.g., adjusted voltage). Vpgm_1 is determined (e.g., by the control unit of memory device 200) in response to information V_offset_1 and voltage Vpgm_0'. Voltage Vpgm_1 can be based on (e.g., a function of) offset information V_offset_1 and voltage Vpgm_0'. For example, Vpgm_1=Vpgm_x'+V_offset_1 or Vpgm_1=Vpgm_0'−V_offset_1. Memory device 200 can use voltage Vpgm_1 as a start voltage for memory cells of the particular sub-block that are coupled to another access line (e.g., access line 252a in FIG. 2).

In another example, in a sampling operation in another program event 502 (e.g., a second repeat program event 502) in a particular sub-block (e.g., sub-block $290_0$), memory device 200 can sample selected memory cells of that particular sub-block coupled to access line 252a. Based on the results of the sampling operation, memory device 200 can generate offset information V_offset_2 and voltage Vpgm_2 (e.g., adjusted voltage). Vpgm_2 is determined (e.g., by the control unit of memory device 200) in response to information V_offset_2 and voltage Vpgm_1. Voltage Vpgm_2 can be based on (e.g., a function of) offset information V_offset_2 and voltage Vpgm_1. For example, Vpgm_2=Vpgm_1+V_offset_2, or Vpgm_2=Vpgm_1−V_offset_2. Memory device 200 can use voltage Vpgm_2 as a start voltage for memory cells of the particular sub-block that are coupled to another access line (e.g., access line 253a in FIG. 2).

Like in method 400, memory device 200 can perform sampling operations in method 500 with or without intervention from an external device. For example, memory device 200 can perform the sampling operations to generate voltages Vpgm_0, Vpgm_1, and Vpgm_2 without specific commands (e.g., sampling commands) to perform the sampling from the external device. Alternatively, memory device 200 can perform the sampling operations to generate voltages Vpgm_0, Vpgm_1, and Vpgm_2 in response to specific commands (e.g., sampling commands) to perform the sampling operations from the external device.

Figure 6:
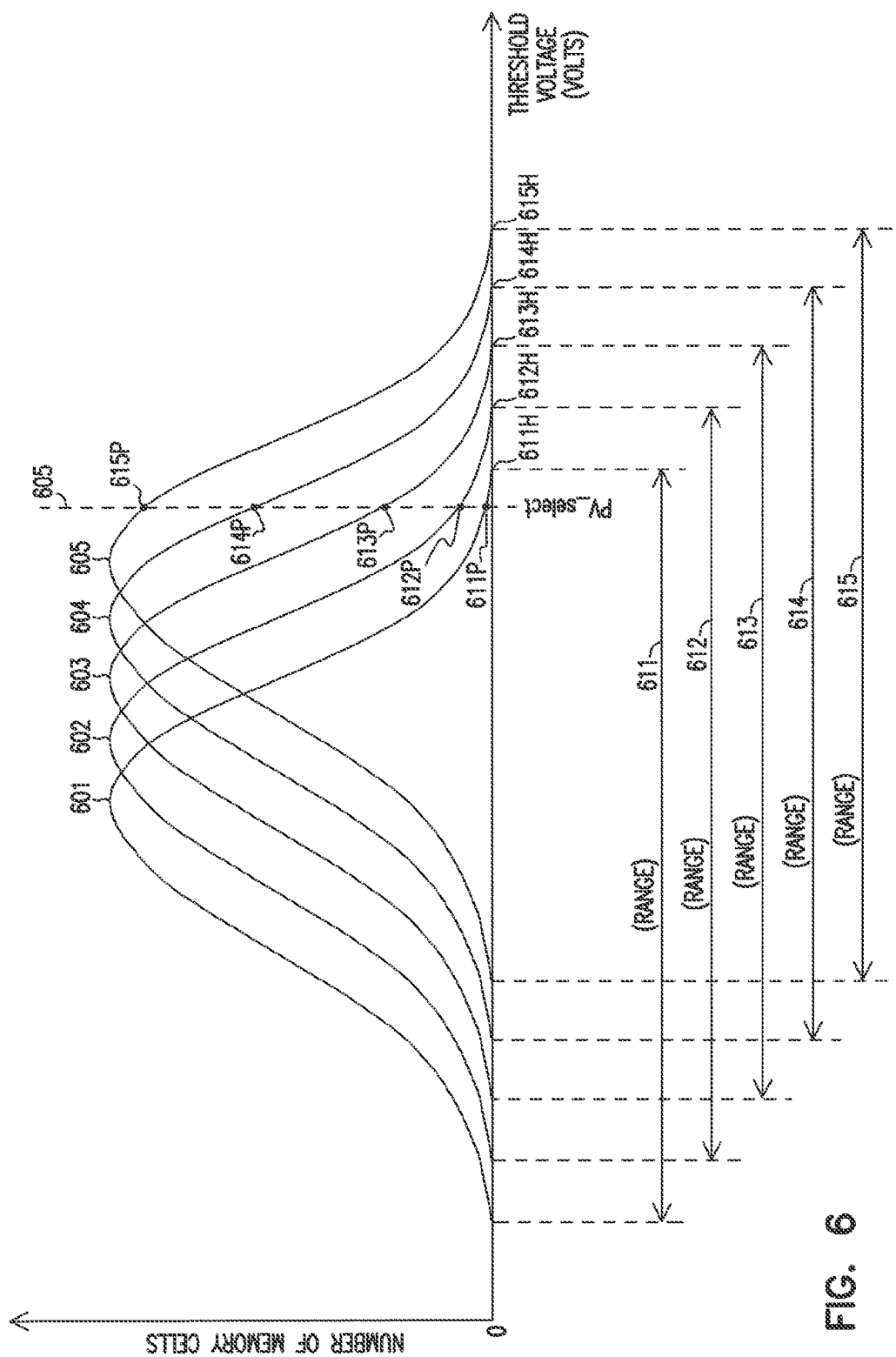
FIG. 6 is a graph of curves showing threshold voltage ranges for a number memory cells of the memory device of FIG. 2, according to some embodiments described herein.

FIG. 6 is a graph of curves 601, 602, 603, 604, and 605 showing threshold voltage ranges 611, 612, 613, 614, and 615, respectively, for a number of memory cells of memory device 200, according to some embodiments described herein. As described above, the threshold voltages of the memory cells of memory device 200 can shift due to cycling (e.g., repeated cycles of write and erase operations). In FIG. 6, curves 601, 602, 603, 604, and 605 can represent examples of threshold voltage ranges of the memory cells after such cycling. FIG. 6 shows five curves 601, 602, 603, 604, and 605 and five corresponding threshold voltage ranges 611, 612, 613, 614, and 615 as an example to help the discussion herein. However, the memory cells of memory device 200 can have more than five threshold voltage ranges.

Curves 601, 602, 603, 604, and 605 can be created based on the characteristics (e.g., known intrinsic properties) of a number of memory cells of memory device 200. Each of curves 601, 602, 603, 604, and 605 can present a normal distribution (e.g., Gaussian distribution) of threshold voltages for a number of memory cells of memory device 200. Memory device 200 can be configured to perform a sampling operation to determine (e.g., predict) which curve among curves 601, 602, 603, 604, and 605 can be a candidate to represent a threshold voltage range of the memory cells of memory device 200 at a particular time during the life of memory device 200. After a particular curve (among curves 601, 602, 603, 604, and 605) is determined, memory device 200 can calculate a voltage value for offset information (e.g., information V_offset) based on that particular curve to adjust the value of a start voltage for a program event (e.g., a subsequent program event).

As described above with reference to FIG. 4 and FIG. 5, memory device 200 can perform a sampling operation to determine count value P (which is the result of the sampling operation). As described above, count value P can indicate (e.g., represent) the number (quantity) of memory cells that have their threshold voltage greater than (exceeding) voltage PV_select (selected threshold voltage). In FIG. 6, the number of memory cells having their threshold voltages greater than voltage PV_select can be the memory cells represented by portions of curves 601, 602, 603, 604, and 605 to the right of line 625 in the direction from voltage PV_select to upper limits 611H, 612H, 613H, 614H, and 615H of threshold voltage ranges 611, 612, 613, 614, and 615, respectively. As shown in FIG. 6, upper limits 611H, 612H, 613H, 614H, and 615H can be near upper tails of curves 601, 602, 603, 604, and 605, respectively. FIG. 6 shows an example of five different count values P that can correspond to five points 611P, 612P, 613P, 614P, and 615P along line 625. Each of points 611P, 612P, 613P, 614P, and 615P can be a point on a particular curve among curves 601, 602, 603, 604, and 605 at the intersection of that particular curve and line 625. Based on the position of the point (e.g., a point similar to points 611P, 612P, 613P, 614P, and 615P) on line 625, the value of information V_offset based on a particular count values P can be calculated based on equation (1) below.

$$V\_offset = (sigma\_H - sigma\_count) * PVS \quad \text{(Equation 1)}$$

Symbol "*" in equation (1) indicates multiplication. As shown in equation (1), the value of information V_offset can be calculated based on the value of parameter PSV multiplied by the difference in values between sigma_H and sigma_count.

In the following description, curves 601, 602, 603, 604, and 605 are used as example for determining the values of parameters in equation (1). However, similar calculation can be used for other curves similar to curves 601, 602, 603, 604, and 605.

In equation (1), parameter sigma_H can represent the sigma (σ) near the upper tail of the normal distribution represent by a particular curve among curves 601, 602, 603, 604, and 605. Based on the known characteristics (e.g., intrinsic properties) of the memory cells of memory device 200, the relationship (e.g., in terms of sigma) between the median and the upper limit (the upper tail) of each of curves 601, 602, 603, 604, and 605 can be predetermined. Thus, the value of parameter sigma_H of a particular curve among curves 601, 602, 603, 604, and 605 can be a predetermined value (e.g., a known sigma relative to the median of that particular curve). In memory device 200, the shape of curves (e.g., normal distribution curves) that represents threshold voltage ranges for a number of memory cells of memory device 200 at different times may be similar (or the same). Thus, the value (predetermined value) of parameter sigma_H can be the same for curves 601, 602, 603, 604, and 605. The value of sigma_H can be stored (e.g., stored in a register) in memory device 200.

In equation 1, parameter sigma_count can represent the sigma (σ) at one of points 611P, 612P, 613P, 614P, and 615P point (which are the points where line 625 intersects a particular curve among of curves 601, 602, 603, 604, and 605). The relationship (e.g., in terms of sigma) between the median of a particular curve (among curves 601, 602, 603, 604, and 605) and a point (among points 611P, 612P, 613P, 614P, and 615P) on that particular curve can be determined based on the property (mathematic relationship) of a normal distribution curve (e.g., one of curves 601, 602, 603, 604, and 605). Thus, the value of parameter sigma_count in equation (1) can correspond to the sigma of one of points 611P, 612P, 613P, 614P, and 615P relative to the median of a particular curve (among curves 601, 602, 603, 604, and 605). The value of sigma_count (relative to the median of a particular curve) is different for different distribution curves (among curves, 601, 602, 603, 604, and 605). Thus, since a particular point among points 611P, 612P, 613P, 614P, and 615P is based on count value P obtained from a particular sampling operation (described above), the value of parameter sigma_count in equation (1) can be determined based on count value P.

In equation (1), parameter PVS is the value (in volt unit per sigma) of one standard deviation (e.g., one sigma of a normal distribution represented by each of curves 601, 602, 603, 604, and 605). Based on the known characteristics (e.g., intrinsic properties) of the memory cells of memory device 200, the parameter PVS can be predetermined. The value (predetermined value) of parameter PVS can be stored (e.g., stored in a register) in memory device 200.

As described above, the values of parameters sigma_H and PVS in equation (1) can be predetermined (e.g., before memory device 200 performs a sampling operation) and stored in memory device 200. The value of parameter sigma_count in equation (1) can be calculate based on count value P obtained from a sampling operation. Therefore, the value of information V_offset can be determined (e.g., calculated) based on equation (1).

Memory device 200 can adjust the start voltage based on the value of information V_offset, such that a particular value for a start voltage of a subsequent program event can correspond to a voltage (e.g., program voltage) that causes the threshold voltages of the memory cells of memory device 200 to be at a threshold voltage at the median of a corresponding curve among curves 602. 602, 603, 604, and 605. For example, memory device 200 can use information V_offset obtained from count value P associated with points 614P to determine (e.g., calculate) a particular value for a start voltage for a subsequent program event, such that such a particular value can correspond to a voltage (e.g., program voltage) that causes the threshold voltages of the memory cells of memory device 200 to be at a threshold voltage at the median of curve 604. In another example, memory device 200 can use information V_offset obtained from count value P associated with points 615P to determine (e.g., calculate) a particular value for a start voltage for a subsequent program event, such that such a particular value can correspond to a voltage (e.g., program voltage) that causes the threshold voltages of the memory cells of memory device 200 to be at a threshold voltage at the median of curve 605.

Memory device 200 can be configured to calculate the value of information V_offset based on equation (1). For example, memory device 200 can include a control unit (e.g., similar to control unit 118 of FIG. 1) having hardware circuitry that can be hard-wired (e.g., hard-coded) to calculate the value for information V_offset based on the values sigma_H, sigma_count, and sigma value PVS in equation (1). Alternatively, memory device 200 can include an arithmetic logic unit (ALU) to that can perform arithmetic operations calculate the value of V_offset (as described below with reference to FIG. 7).

Thus, as described above (e.g., with reference to FIG. 4 and FIG. 5), memory device 200 can determine a count value P, which is the number (quantity) of memory cells that have their threshold voltages greater than (exceeding) a selected threshold voltage (e.g., PV_select in FIG. 6). Based on count value P, memory device 200 can determine the value for parameter sigma_count, which can correspond to a point (e.g., one of points 601P, 602P, 603P, 604P, and 605P in FIG. 6) on a distribution curve (e.g., one of curves 601, 602, 603, 604, and 605 in FIG. 6). The combination of parameter sigma_count (obtained based on count value P from a sampling operation), parameter sigma_H (based on characteristics of a distribution curve), and parameter PSV, allows memory device 200 to calculate the value for information V_offset. As described above with reference to FIG. 4 and FIG. 5, information V_offset can be used to adjust the start voltage for a subsequent program event to improve operation of memory device 200.

Some conventional memory devices may have techniques to provide a start voltage for a subsequent program based on a fixed programing voltage. Such techniques may be less accurate than the techniques described herein.

Figure 7:
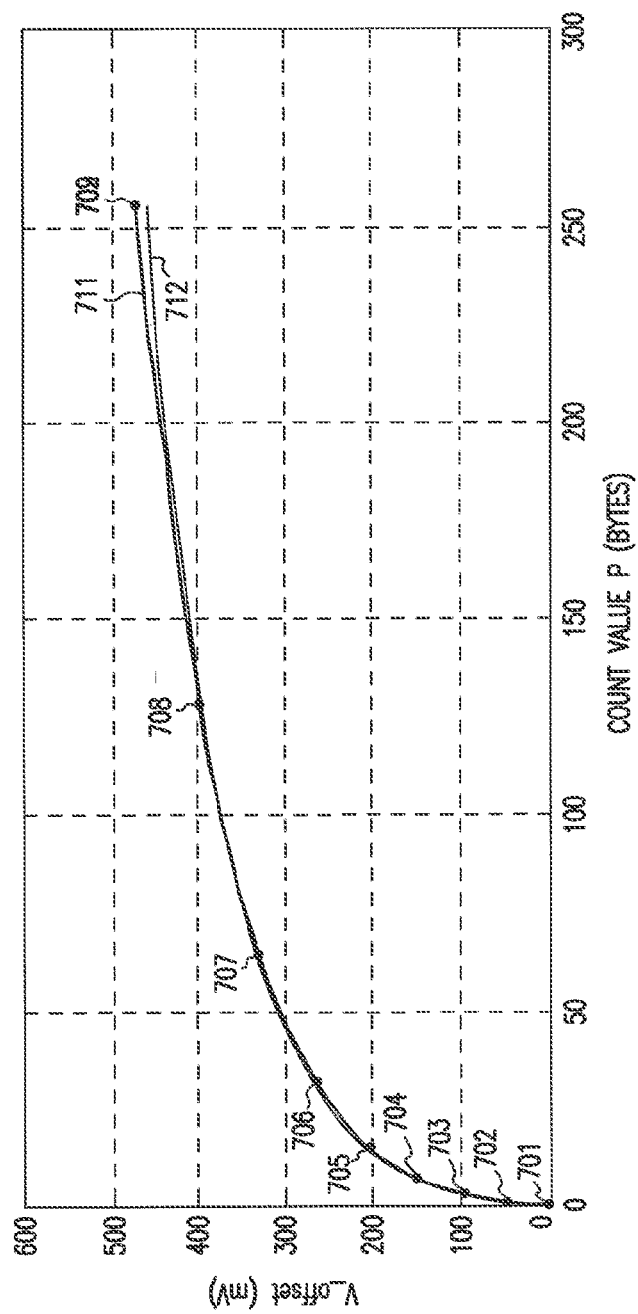
FIG. 7 is a graph of curves showing an example relationship between a count value and offset information based on different sampling operations performed in the memory device of FIG. 2, according to some embodiments described herein.

FIG. 7 is graph of curves 711 and 712 showing an example relationship between count value P and information V_offset based on different sampling operations performed in memory device 200, according to some embodiments described herein. Curve 711 can represent an actual relationship between count value P and information V_offset. Curve 712 can represent a logarithmic curve-fit model based on curve 711. Curve 711 can be created based on data points collected from characterizing the memory cells of memory device 200. The data points can be collected based on a prediction of variations (e.g., shift) in the threshold voltage ranges for a number of memory cells with respect to a program voltage applied at an access line (e.g., word line) in a program event included in a write operation of memory device 200. Such a prediction is described above with reference to FIG. 6 in which curves 601 602, 603, 604, and 605 can present the variations in the threshold voltage ranges.

In FIG. 7 shows an example range of values (e.g., from zero to 300 bytes) for count value P in the horizontal axis (x-axis), and an example range of values (e.g., from zero millivolts to 600 millivolts) for information V_offset in the vertical axis (y-axis). One skilled in the art can recognize that a relationship between count value P and information V_offset for a particular memory device (e.g., a NAND memory device similar to memory device 200) may not be the same as the relationship represented by curves 711 and 712. However, the curves for such a relationship in a particular memory device can have a similar shape as curve 711 or curve 712. FIG. 7 shows example data points 701 through 709 on curve 711. Each particular data point among data points 701 through 709 can correspond to an x-y coordinates of curve 711 at that particular data point. Data points 701 through 709 can include values 1, 2, 4, 8, 16, 32, 64, 128, and 256 (number of bytes) in the x-axis (count value P), respectively, and values 0, 47, 96, 149, 204, 264, 328, 400 and 479 (voltage amount in millivolts), in the y-axis (V_offset). These values from curve 711 are example values. As described below with reference to FIG. 8, these example values can be stored in a table (e.g., lookup table) to allow memory device 200 to determine the value of information V_offset based on a particular value of count value P. Alternatively (as described herein with reference to FIG. 7), memory device 200 can determine the value of information V_offset using a curve-fit model based on curve 712.

In the example of FIG. 7, curve 712 can be presented by equation (2) below.

$$V\_offset = 85.5 * \ln(\text{count value } P) - 18.4 \qquad (2)$$

Symbol "*" in equation (2) indicates multiplication. As mentioned above, curves 711 and 712 can represent an example relationship between count value P and information V_offset. Thus, the relationship between count value P and information V_offset can be based on equation (2) associated with curve 712 (which is a curve-fit model based on curve 711). Based on equation (2), the value of information V_offset can be determined (calculated).

The value of information V_offset can be calculated based on a general form of Equation (2), for example, V_offset=A*ln(count value P)–B, where elements (e.g., constants) A and B are real numbers. Equation (2) shows an example where the values of elements A and B are 85.5 and 18.4, respectively, based on the shape of curves 712. However, the values of elements A and B can be different from 85.5 and 18.4, respectively.

Memory device 200 can be configured to determine the value of information V_offset based on equation (2). For example, memory device 200 can be configured to include an ALU that can perform arithmetic operations to calculate (e.g., directly calculate) the value of information V_offset based on count value P. The ALU can be part of a control unit of memory device 200 that can be similar to or the same as control unit 118 in FIG. 1. As an example, memory device 200 can use count value P (obtained from a sampling operation performed by memory device 200) as an input for equation (2) and perform mathematic (e.g., arithmetic) operations as defined by equation (2) to obtain the value for information V_offset.

In an alternative configuration, calculation for the value of information V_offset can be performed by an external device outside memory device 200. For example, an external device (e.g., a memory controller) can include a component (e.g., an ALU) to calculate the value of information V_offset based on equation (2). In the alternative configuration, for example, memory device 200 and such an external device can be part of the same device or the same memory system (e.g., a solid state drive (SSD) device or SSD system). The ALU unit (either included in memory device 200 or included in an external device) can include hardware (e.g., circuity (e.g., digital circuits)) to perform the calculation described herein (e.g., to calculate the value of information V_offset).

As described above with reference to FIG. 7, memory device 200 can determine (e.g., calculate) the value of information V_offset based on mathematic calculation using a curve-fit model (e.g., based on equation (2)). However, memory device 200 can alternatively (or additionally) determine the value of information V_offset using a different technique, as described below with reference to FIG. 8.

FIG. 8 is a table (e.g., lookup table) 801 showing entries 811 through 819 containing example values of count value P and entries 821 through 829 containing example values of information V_offset, according to some embodiments described herein. Memory device 200 can include a memory structure that can be part of the control unit (or outside the control unit) of memory device 200. The memory structure can include memory components (e.g., registers) to store entries 811 through 819 and 821 through 829. Entries 811 through 819 can have different values where each of the values indicates a number of bits (e.g., number of bytes). Entries 821 through 829 can have different values where each of the values indicates an amount of voltage (e.g., in millivolts). The values of entries 811 through 819 and 821 through 829 can be predetermined values. The values of entries 811 through 819 and 821 through 829 can be stored in the memory structure before memory device 200 perform a sampling operation (or sampling operations).

The values of entries 811 through 819 and 821 through 829 can be determined (e.g., obtained) from data points obtained from characterizing the number cells of memory device 200 described above with reference to FIG. 7. For example, as shown in FIG. 8, the values of entries 811 through 819 can be the values of count value P (in the horizontal axis) of data points 701 through 709, respectively, of curve 711. The values of entries 821 through 829 can be the values of information V_offset (in the vertical axis) of data points 701 through 709, respectively, of curve 711. Thus, as shown in table 801, each value of count value P can be associated with a different value of information V_offset based on the values of a data point among data points 701 through 709 in FIG. 7. For example, as shown in table 801, the values in entries 812 and 822 can be from data point 702 (FIG. 7), such that a count value P of two bytes (in entry 812) can be associated with a voltage amount of 47 millivolts (in entry 822). In another example, the values in entries 815 and 825 can be from data point 705 (FIG. 7), such that a count value P of 16 bytes (in entry 815) can be associated with a voltage amount of 204 millivolts (in entry 825). Other values in table 801 are based on other data points in FIG. 7.

Table 801 shows an example of nine entries (and example values) for information V_offset and nine associated entries (and example values) for count value P. However, table 801 can include a different number of entries for information V_offset and associated entries for count value P. For example, additional entries can be obtained from additional data points on curve 711.

Memory device 200 can be configured to determine the value of information V_offset based on table 801. As described above with reference to FIG. 4 and FIG. 5, memory device 200 can determine the value of count value P based on the result of a sampling operation. After determining the value of count value P, memory device 200 can access table 801 (e.g., access a memory structure that includes (e.g., stores) table 801) to determine the value for information V_offset. For example, in response to a determination that a particular count value P of 16 bytes resulted from a sampling operation, memory device 200 access table 801 and determine that the value of information V_offset is 204 millivolts. In this example, memory device 200 can use 204 millivolts to adjust the value of a start voltage in a program event. In another example, in response to a determination that a particular count value P of 4 bytes resulted from a sampling operation, memory device 200 can access table 801 and determine that the value of information V_offset is 96 millivolts. In this example, memory device 200 can use 96 millivolts to adjust the value of a start voltage in a program event.

As described above with reference to FIG. 1 through FIG. 8, a memory device (e.g., memory device 200) described herein can perform a sampling operation in a program event to obtain a result (e.g., count value P). Based on the result of the sampling operation, the memory device can determine a value of offset information (e.g., information V_offset). The memory device can adjust a value of a start voltage for a program event based on the offset information to improve operations (e.g., write operations) of the memory device.

FIG. 9 shows a side view of a structure of a portion of memory device 200, according to some embodiments described herein. Memory device 200 can include a substrate 990 and a memory cell portion (e.g., a memory cell array) 931 that include memory cell string $230_0$. For simplicity, FIG. 9 shows only a portion of memory device 200 including the structure of memory cell string $230_0$ (which is schematically shown in FIG. 2). However, other memory cell strings of memory device 200 shown in FIG. 2 can have similar (or the same) structure as memory cell string $230_0$ shown in FIG. 9.

As shown in FIG. 9, memory device 200 can include levels (internal physical device levels) 910, 911, 912, and 913. Memory cells 210, 211, 212, and 213 can be located on levels 910, 911, 912, and 913, respectively. Memory device 200 can also include circuitry 921 that can be located (e.g., formed directly) under memory cell portion 931.

In FIG. 9, substrate 990 can include a semiconductor substrate (e.g., silicon-based substrate). For example, substrate 990 can include a p-type silicon substrate or an n-type silicon substrate. Memory cells 210, 211, 212, and 213 can be located one over another in respective levels 910, 911, 912, and 913, respectively, in a z-direction of memory device 200. The Z-direction can extend in a direction associated with the thickness of substrate 990. FIG. 9 also shows the x-direction, which is perpendicular to the z-direction.

Memory cell portion 931 can include a pillar 932 having a length extending in the Z-direction. At least a portion of pillar 932 can be part of memory cell string $230_0$. As shown in FIG. 9, memory cells 210, 211, 212, and 213 can be located along respective portions of pillar 932 in the z-direction. Pillar 932 can include a conductive material (e.g., conductively doped polysilicon) that can be configured (e.g., structured) to allow a conduction of current between a conductive region 970 and a conductive region 999. Conductive region 970 can be part of data line 270 (e.g., a local bit line, labeled as "BL0") of memory device 200. Conductive region 999 can be part of a source (e.g., a source region, a source line, or a source plate, labeled as "SRC") of memory device 200.

As shown in FIG. 9, control gates 250b, 251b, 252b, and 253b can be located along respective portions of pillar 932 in the Z-direction. As described above with reference to FIG. 2, control gates 250b, 251b, 252b, and 253b can be part of access lines 250a, 251a, 252a, and 253a (FIG. 2), respectively, of memory device 200. The materials of control gates 250b, 251b, 252b, and 253b (FIG. 9) can include a conductive material (e.g., conductively doped polysilicon, metal, other conductive material).

As shown in FIG. 9, gates 280b and 285b can be located along respective portions of pillar 932 in the z-direction. As described above with reference to FIG. 2, gates 280b and 285b can form part of source select line 280a (FIG. 2) and part of a drain select line 285a (FIG. 2), respectively, of memory device 200. The materials of gates 280b and 285b (FIG. 9) can include a conductive material (e.g., conductively doped polysilicon, metal, other conductive material).

Memory cell string $230_0$ can include materials 903, 904, 905 between a portion of pillar 932 and a respective control gate among control gates 250b, 251b, 252b, and 253b. Material 903 can also be between pillar 932 and each of select gates 280b and 285b. As shown in FIG. 9, materials 903, 904, and 905 can be separated among memory cells 210, 211, 212, and 213. Materials 903, 904, and 905 located at a particular memory cell (among memory cells 210, 211, 212, and 213) can be part (e.g., a memory element) of that particular memory cell.

Material 903 can include a charge blocking material (or charge blocking materials), for example, a dielectric material (e.g., silicon nitride) that is capable of blocking a tunneling of a charge.

Material 904 can include a charge storage material (or charge storage materials) that can provide a charge storage function to represent a value of information stored in memory cells 210, 211, 212, and 213. For example, material 904 can include polysilicon (e.g., conductively doped polysilicon), which can be either a p-type polysilicon or an n-type polysilicon. The polysilicon can be configured to operate as a floating gate (e.g., to store charge) in a memory cell (e.g., a memory cell 210, 211, 212, or 213). In another example, material 904 can include a dielectric material (e.g., silicon-nitride based material or other dielectric materials) that can trap charge in a memory cell (e.g., a memory cell 210, 211, 212, or 213).

Material 905 can include a tunnel dielectric material (or tunnel dielectric materials), for example, silicon dioxide, that is capable of allowing tunneling of a charge (e.g., electrons).

Circuitry 921 can include circuit elements (e.g., transistors) that can be configured to perform part of a function of a memory device (e.g., memory device 200). For example, circuitry 921 can include decoder circuits, driver circuits, buffers, sense amplifiers, charge pumps, and other circuitry of memory device 200. FIG. 9 symbolically shows the circuit elements of circuitry 921 including example transistors T1A and T1B. Transistors T1A and T1B can be coupled to part of memory cell portion 931 through conductive paths (not shown). Such conductive paths can include a conductive segment (e.g., vertical conductive structures, not shown)

extending in the Z-direction. For example, transistor T1A can be part of a driver circuit (e.g., a word line driver) of memory device 200, in which transistor T1A can be coupled (through a conductive path, not shown) to one of control gates 250*b*, 251*b*, 252*b*, and 253*b* (e.g., part of respective local word lines). In another example, transistor T1B can be part of a sense amplifier of memory device 200, in which transistor T1B can be coupled (through a conductive path, not shown) to conductive region 970 (e.g., part of a local bit line). Circuitry 921 can also be part of a control unit of memory device 200 that can include components to perform sampling operations and adjustment of a start voltage as described above with reference to FIG. 2 through FIG. 8.

FIG. 10 shows an apparatus in the form of a system (e.g., electronic system) 1000 including a memory device, according to some embodiments described herein. Part of system 1000 or the entire system 1000 can include or be included a system-on-chip, a system on package, a solid state drive, a cellphone, a tablet, a computer, an electronic module in an automobile, or other types of electronic systems. As shown in FIG. 10, system 1000 can include a processor 1010, a memory device 1020, a memory controller 1030, a graphics controller 1040, an I/O controller 1050, a display 1052, a keyboard 1054, a pointing device 1056, at least one antenna 1058, a connector 1015, and a bus 1060 (e.g., conductive lines formed on a circuit board (not shown) of system 1000).

In some arrangements, system 1000 does not have to include a display. Thus, display 1052 can be omitted from system 1000. In some arrangements, system 1000 does not have to include any antenna. Thus, antenna 1058 can be omitted from system 1000.

Each of processor 1010, memory device 1020, memory controller 1030, graphics controller 1040, and I/O controller 1050 can include a die and can be part of an IC package.

Processor 1010 can include a general-purpose processor or an application specific integrated circuit (ASIC). Processor 1010 can include a central processing unit (CPU).

Display 1052 can include a liquid crystal display (LCD), a touchscreen (e.g., capacitive or resistive touchscreen), or another type of display. Pointing device 1056 can include a mouse, a stylus, or another type of pointing device.

I/O controller 1050 can include a communication module for wired or wireless communication (e.g., communication through one or more antennas 1058). Such wireless communication may include communication in accordance with WiFi communication technique, Long Term Evolution Advanced (LTE-A) communication technique, or other communication techniques.

I/O controller 1050 can also include a module to allow system 1000 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1015 can be arranged (e.g., can include terminals, such as pins) to allow system 1000 to be coupled to an external device (or system). This may allow system 1000 to communicate (e.g., exchange information) with such a device (or system) through connector 1015. Connector 1015 may be coupled to I/O controller 1050 through a connection 1016 (e.g., a bus).

Connector 1015, connection 1016, and at least a portion of bus 1060 can include elements (e.g., conductive terminals, conductive lines, or other conductive elements) that conform with at least one of USB, DP, HDMI, Thunderbolt, PCIe, Ethernet, and other specifications.

Memory device 1020 can include a dynamic random-access memory (DRAM) device, a static random-access memory (SRAM) device, a flash memory device (e.g., NAND flash memory device), phase change memory, a combination of these memory devices, or other types of memory.

In an example, memory device 1020 can include memory device 100 or memory device 200 described above with reference to FIG. 1 through FIG. 9. Thus, memory device 1020 can include the structure and operation of memory device 200 described above with reference to FIG. 2 through FIG. 9. For example, memory device 1020 can perform a sampling operation a program event to adjust a start voltage of a subsequent program event in memory device 1020. Memory device 1020 can perform the sampling operation without intervention (e.g., without a command to perform the sampling operation) from a host (e.g., from a processor 1010 or a memory controller 1050). Alternatively, memory device 1020 can perform the sampling operation with an intervention (e.g., based on commands to perform the sampling operation) from a host (e.g., from processor 1010 or a memory controller 1050).

FIG. 10 shows the elements (e.g., devices and controllers) of system 1000 arranged separately from each other as an example. In some arrangements, two or more elements (e.g., processor 1010, memory device 1020, graphics controller 1040, and I/O controller 1050) of system 1000 can be located on the same IC package.

The illustrations of the apparatuses (e.g., memory devices 100 and 200, and system 1000) and methods (e.g., methods 400 and 500 and operations performed by memory devices 100 and 200) are intended to provide a general understanding of the structure of various embodiments and are not intended to provide a complete description of all the elements and features of an apparatus that might make use of the structures described herein.

The apparatuses (e.g., memory devices 100, 200, and 1020, including memory control unit 118 in FIG. 1, and system 1000) described above, may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory devices 100 and 200, and system 1000 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10 include apparatus and methods using access lines, first memory cells coupled to an access line of the access lines, and a control unit including circuitry. The control unit is configured to apply a first voltage to the access line; check first threshold voltages of the first memory cells after applying the first voltage; obtain offset information based on a determination that at least one of the first threshold voltages is greater than a selected voltage; generate a second voltage, the second voltage being a function of the first voltage and the offset information; and apply the second voltage to one of the access lines during an operation of storing information in second memory cells. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A memory device comprising:
an array of memory cells;
access lines, wherein first memory cells of the array of memory cells are associated with an access line of the access lines;
circuitry configured to:
initiate applying a first voltage to the access line;
check first threshold voltages of the first memory cells based on the applying of the first voltage;
obtain information responsive to at least one of the first threshold voltages being greater than a selected voltage, the information associated with a voltage;
generate a second voltage based on the first voltage and the information; and
initiate applying the second voltage to one of the access lines during an operation of storing information in second memory cells of the array of memory cells.

2. The memory device of claim 1, further comprising a memory structure to store entries associated with different amount of voltages, wherein the information corresponds to one of the amount of voltages.

3. The memory device of claim 1, further comprising an arithmetic logic unit to calculate a value of the voltage associated with the information.

4. The memory device of claim 1, wherein a value of the second voltage is a sum of values of the first voltage and the voltage associated with the information.

5. The memory device of claim 1, wherein the selected voltage is within a threshold voltage range of the first memory cells.

6. The memory device of claim 1, wherein the circuitry is configured to apply a sequence of pulses to the access line during the operation of storing information in the second memory cells, and the second voltage is included in a pulse of the sequence of pulses.

7. The memory device of claim 6, wherein the circuitry is configured to apply the second voltage in the pulse of the sequence of pulses, and the pulse of the sequence of pulses occurs before the rest of the sequence of pulses occurs.

8. A memory device comprising:
an array of memory cells;
a first access line and a second access line;
first memory cells associated with the first access line;
second memory cells associated with the second access line; and
circuitry configured to:
initiate applying a first voltage to the first access line;
check first threshold voltages of at least a portion of the first memory cells based on the applying of the first voltage;
obtain a first information responsive to at least one of the first threshold voltages being greater than a selected voltage, the first information associated with a voltage;
store the first information;
initiate applying a second voltage to the second access line, the second voltage having a value based on the first information;
check second threshold voltages of at least a portion of the second memory cells based on the applying the second voltage;
obtain a second information responsive to at least one of the second threshold voltages being greater than the selected voltage, the second information associated with an additional voltage; and
store the second information.

9. The memory device of claim 8, wherein the first memory cells and the second memory cells are included in a same sub-block among sub-blocks of a block of the memory device.

10. The memory device of claim 8, wherein the circuitry is configured to:
apply a third voltage to a third access line coupled to third memory cells, the third voltage having a value based on the second information;
check third threshold voltages of at least a portion of the third memory cells based on the applying of the third voltage;
obtain a third information responsive to at least one of the third threshold voltages being greater than the selected voltage, the third information is associated with a second additional voltage; and
store the third information.

11. The memory device of claim 10, wherein the first access line is located next to the second access line, and the second access line is located next to the third access line.

12. The memory device of claim 10, wherein a value of the second voltage is a sum of values of the first voltage and the voltage associated with the first information.

13. The memory device of claim 12, wherein a value of the third voltage is a sum of values of the second voltage and the second additional voltage associated with the third information.

14. A memory device comprising:
memory cells;
access lines associated with the memory cells;
circuitry configured to:
apply a first voltage to one of the access lines during a first operation performed on first memory cells of the memory cells;
determine a count value during the first operation, the count value corresponding to a number of memory cells having respective threshold voltages greater than a selected voltage, the number of memory cells being part of the first memory cells;
generate a second voltage having a value based on the count value; and
apply the second voltage to one of the access lines during a second operation performed on second memory cells of the memory cells.

15. The memory device of claim 14, wherein the first voltage and the second voltage are applied to a same access line of the access lines.

16. The memory device of claim 14, wherein:
the first voltage is applied to a first access line of the access lines; and
the second voltage is applied to a second access line of the access lines.

17. The memory device of claim 14, wherein:
the first memory cells are included in a first sub-block of the memory device; and
the second memory cells are included in a second sub-block of the memory device.

18. The memory device of claim 14, wherein the first memory cells and the second memory cells are included in a same sub-block of the memory device.

19. The memory device of claim 14, wherein the first voltage has a value less than a value of the second voltage.

20. The memory device of claim 14, wherein the first voltage has a value greater than a value of the second voltage.

* * * * *